(12) United States Patent
Jin et al.

(10) Patent No.: US 11,876,040 B2
(45) Date of Patent: Jan. 16, 2024

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Sang Hyun Jin, Incheon (KR); Young Jin Kang, Gwangju (KR); Jin Suk Jeong, Incheon (KR); Yun Kyung Jeong, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 73 days.

(21) Appl. No.: 17/329,721

(22) Filed: May 25, 2021

(65) Prior Publication Data
US 2022/0384323 A1    Dec. 1, 2022

(51) Int. Cl.
*H01L 23/498* (2006.01)
*H01L 21/48* (2006.01)
*H01L 23/31* (2006.01)
*H01L 23/00* (2006.01)

(52) U.S. Cl.
CPC ...... *H01L 23/49822* (2013.01); *H01L 21/481* (2013.01); *H01L 21/4857* (2013.01); *H01L 23/49838* (2013.01); *H01L 23/3128* (2013.01); *H01L 24/16* (2013.01); *H01L 2224/16227* (2013.01)

(58) Field of Classification Search
CPC ........... H01L 23/49822; H01L 21/4857; H01L 23/49838
See application file for complete search history.

(56) References Cited

U.S. PATENT DOCUMENTS

| | | | |
|---|---|---|---|
| 6,930,256 B1 | 8/2005 | Huemoeller et al. | |
| 2010/0136781 A1* | 6/2010 | Kulkarni | H01L 23/528 257/E21.585 |
| 2012/0322261 A1* | 12/2012 | Shue | H01L 21/76846 257/E21.585 |
| 2016/0268199 A1* | 9/2016 | Lee | H01L 23/5226 |
| 2017/0229358 A1* | 8/2017 | Cooney, III | H01L 23/544 |
| 2022/0077078 A1* | 3/2022 | Jeong | H01L 21/6835 |

\* cited by examiner

*Primary Examiner* — Selim U Ahmed
*Assistant Examiner* — Evan G Clinton
(74) *Attorney, Agent, or Firm* — Spectrum IP Law Group LLC

(57) ABSTRACT

In one example, an electronic device, comprises a substrate, comprising a first dielectric having a top surface and a bottom surface, and a first conductor in the first dielectric and comprising a first via and a first trace over the first via. The first trace comprises a first trace sidewall and a first trace base, and the first via comprises a first via sidewall. The first conductor comprises a first arcuate vertex between the first trace sidewall and the first trace base, and a second arcuate vertex between the first via sidewall and the first trace base, an electronic component over the top surface of the substrate, and an encapsulant over the top surface of the substrate and contacting a lateral side of the electronic component. Other examples and related methods are also disclosed herein.

18 Claims, 24 Drawing Sheets

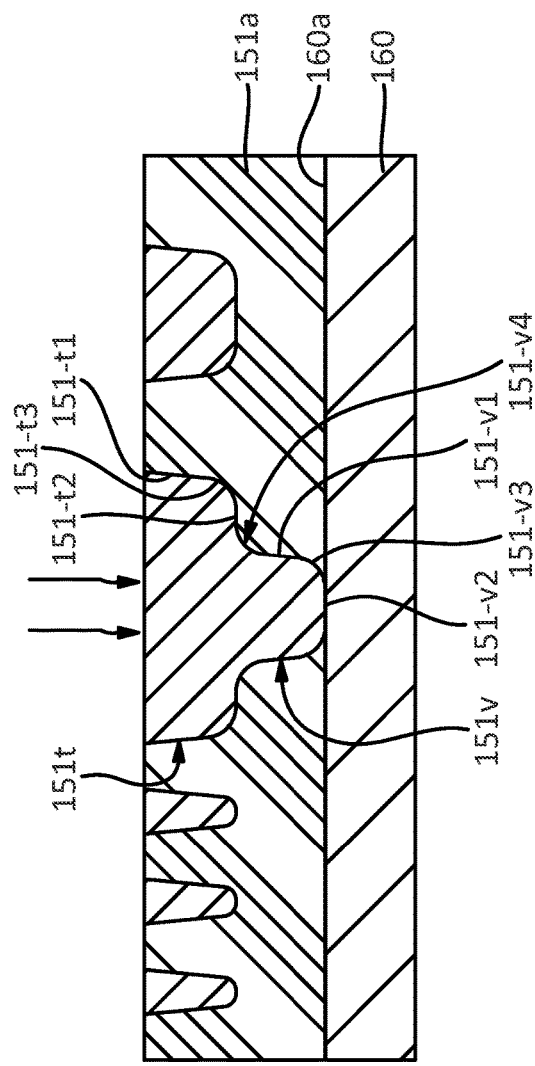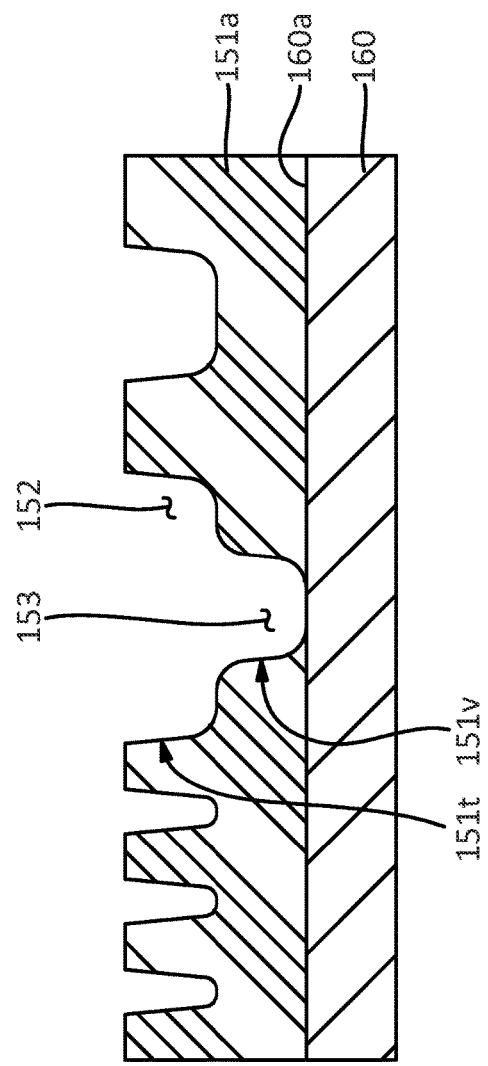

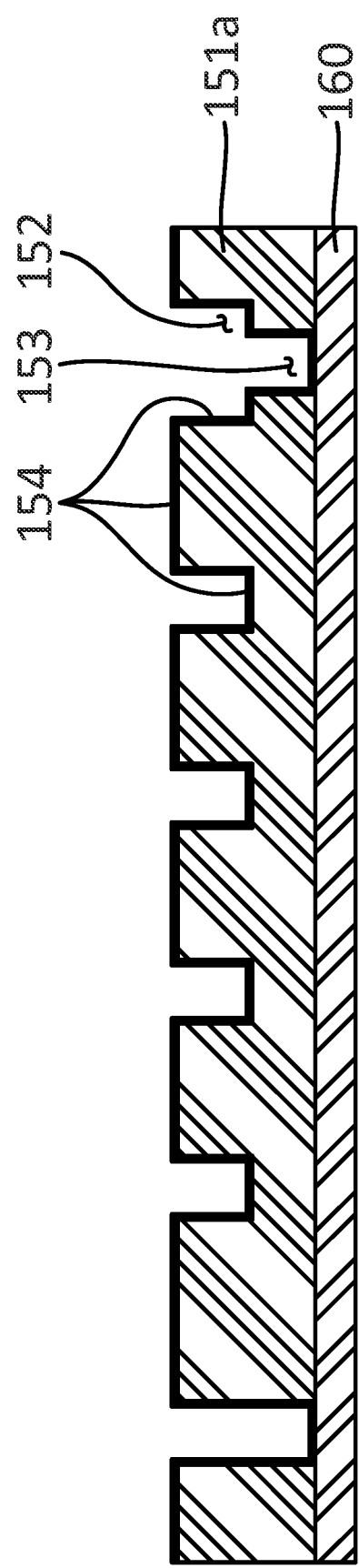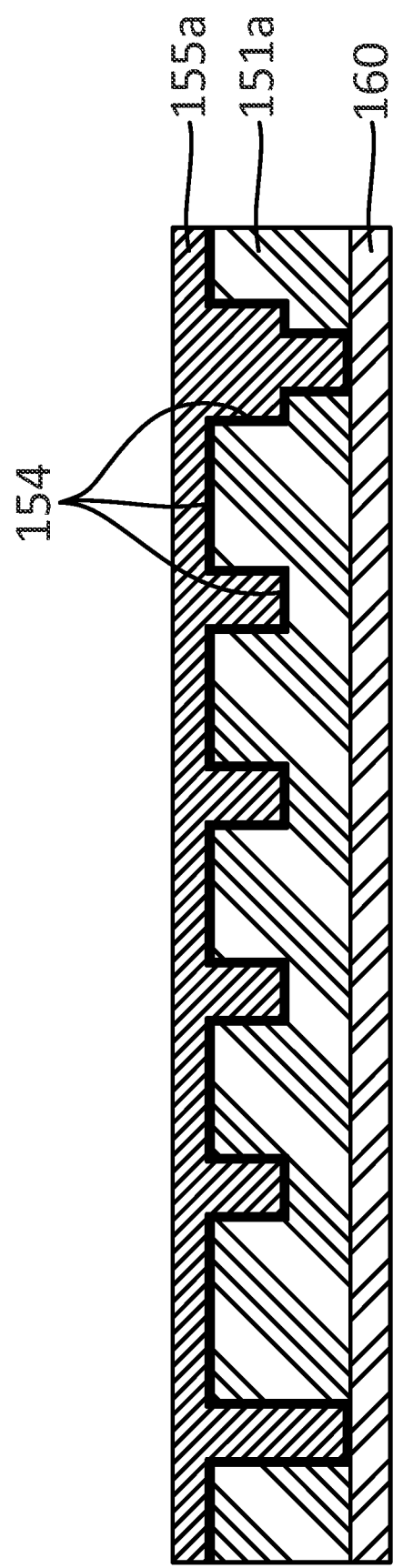
FIG.3E
FIG.3F

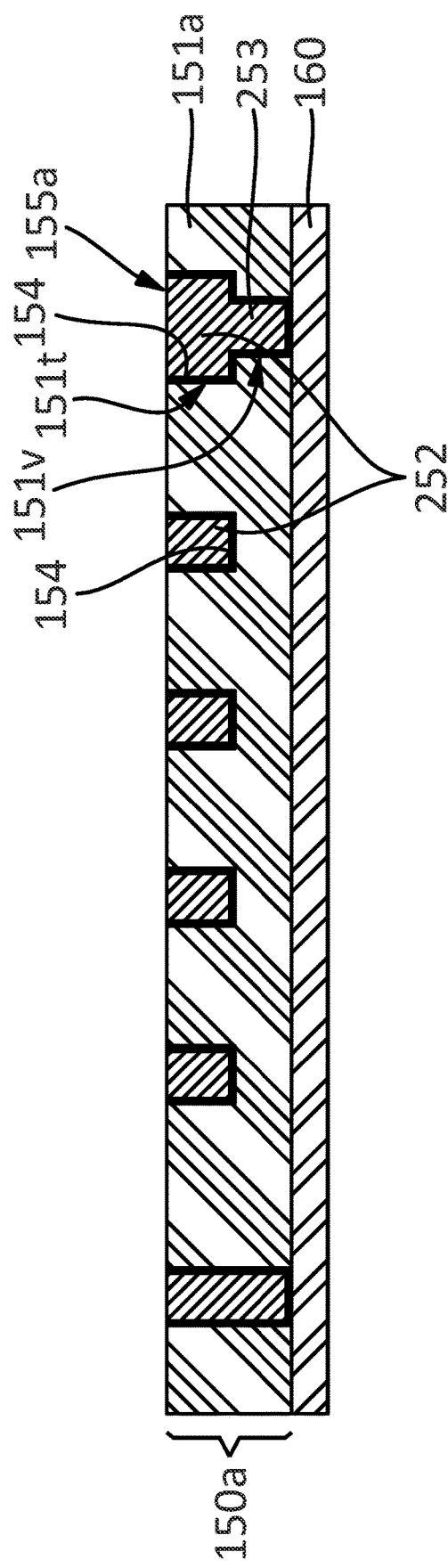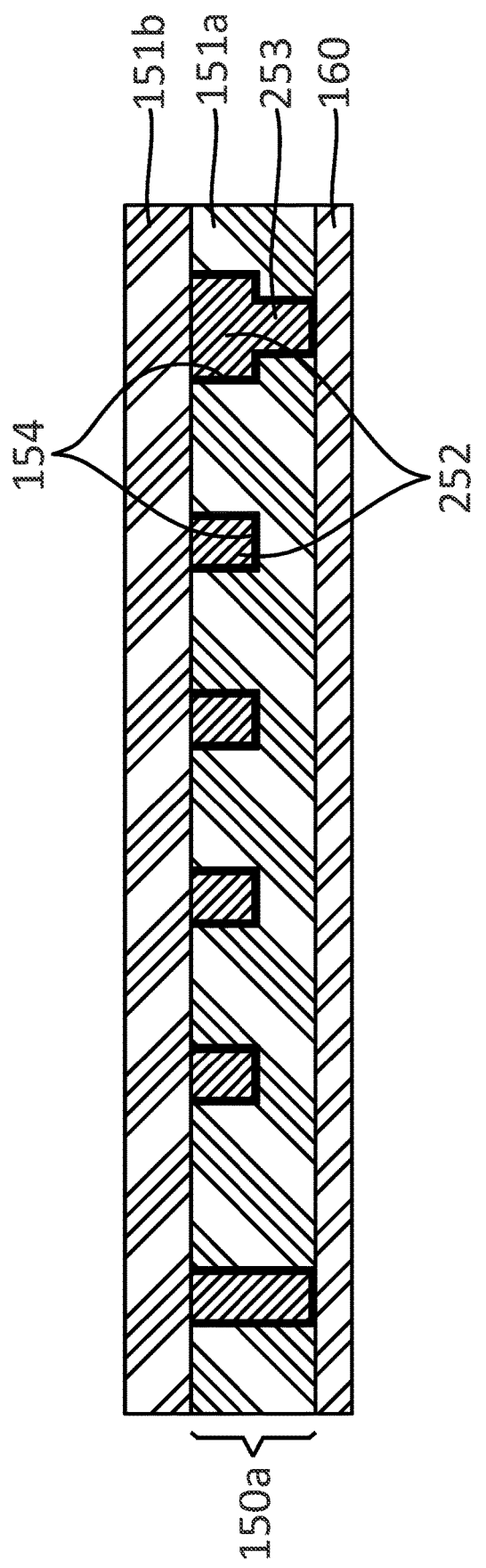
FIG.3G
FIG.3H

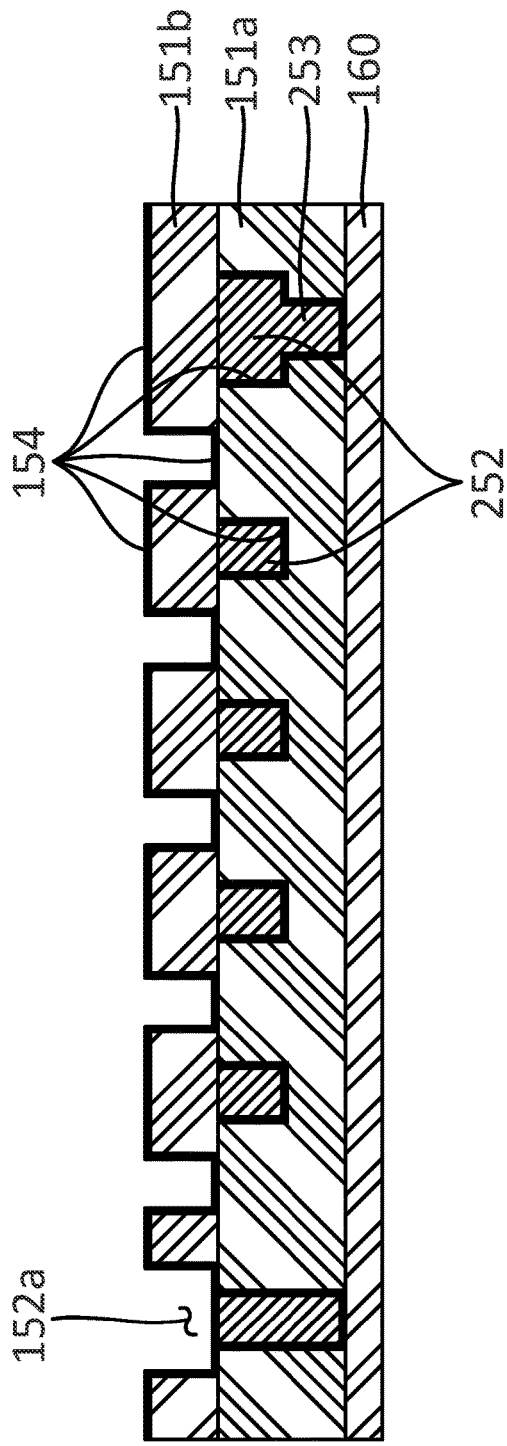
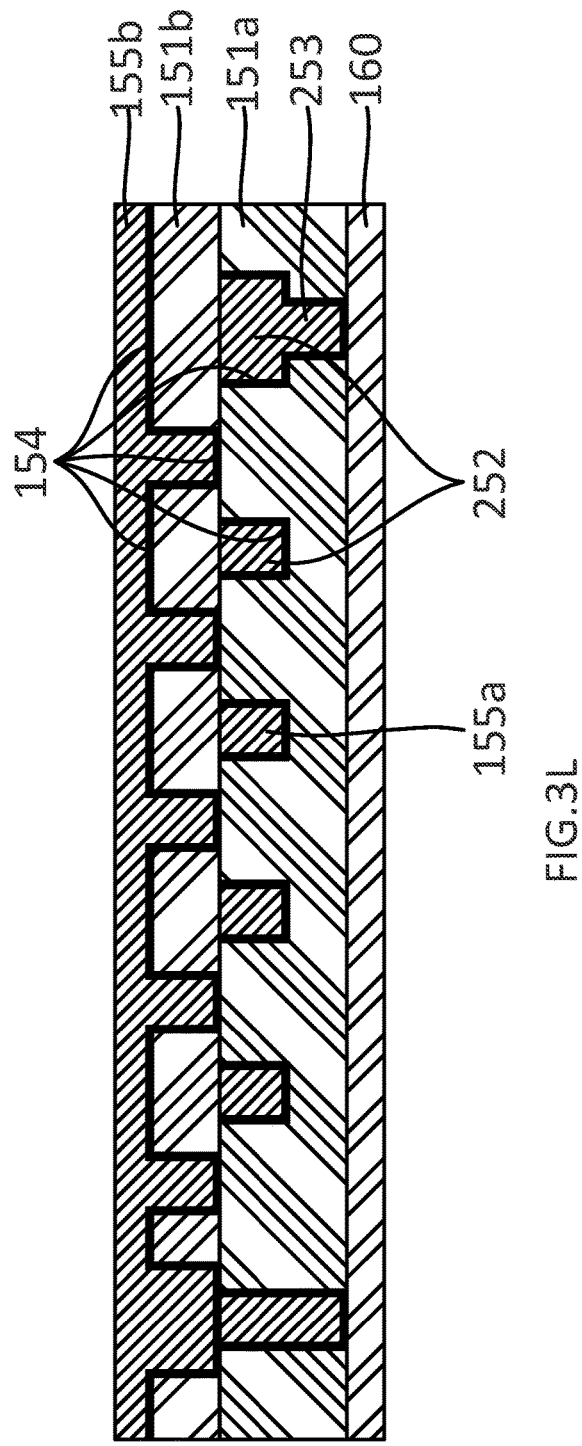
FIG.3K
FIG.3L

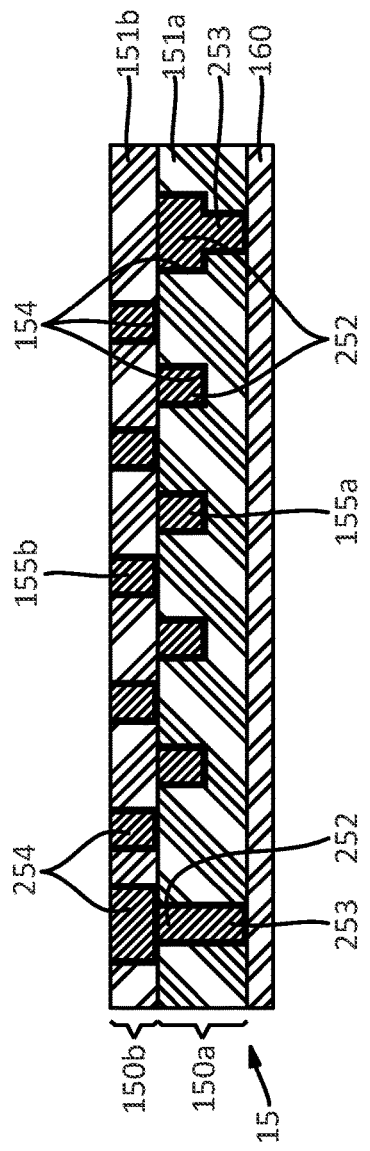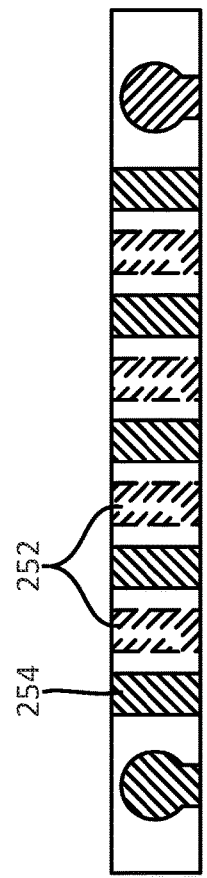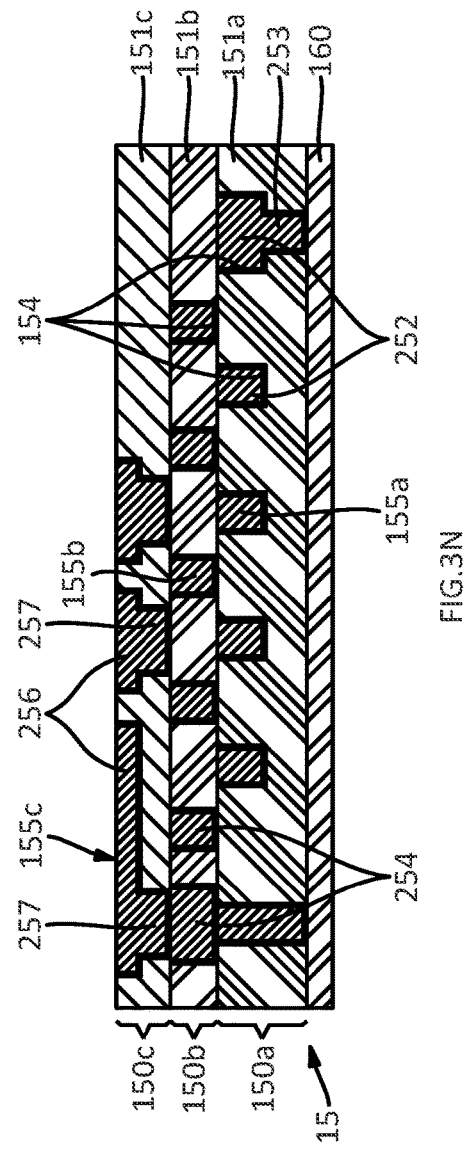

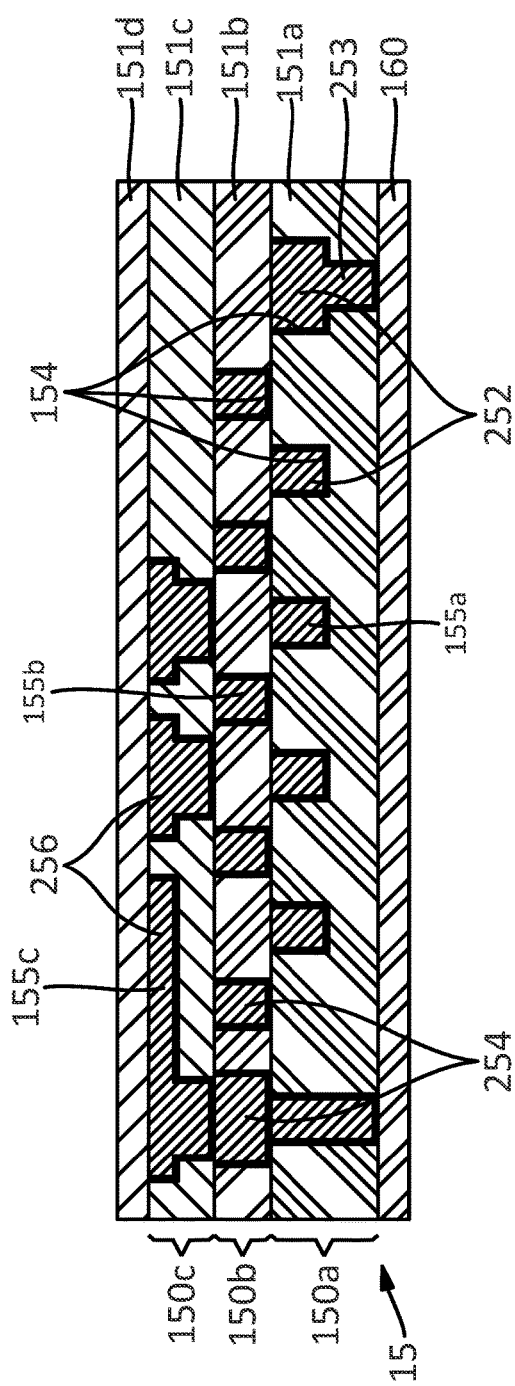
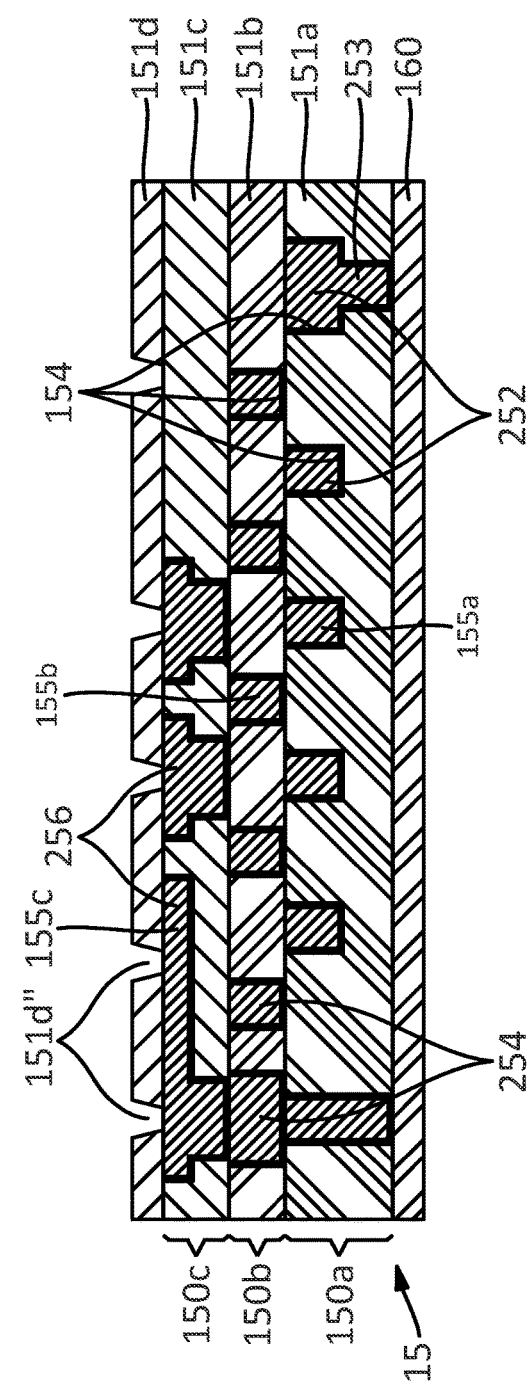
FIG.3O
FIG.3P

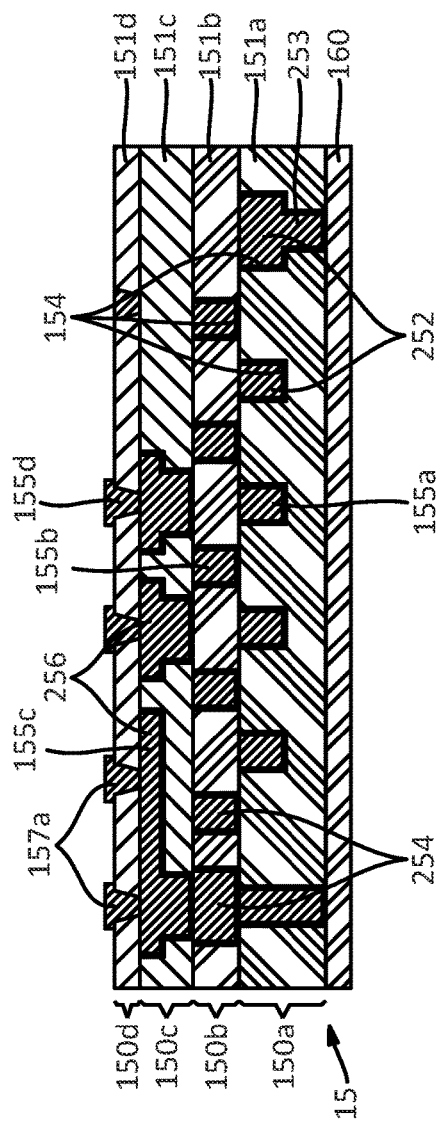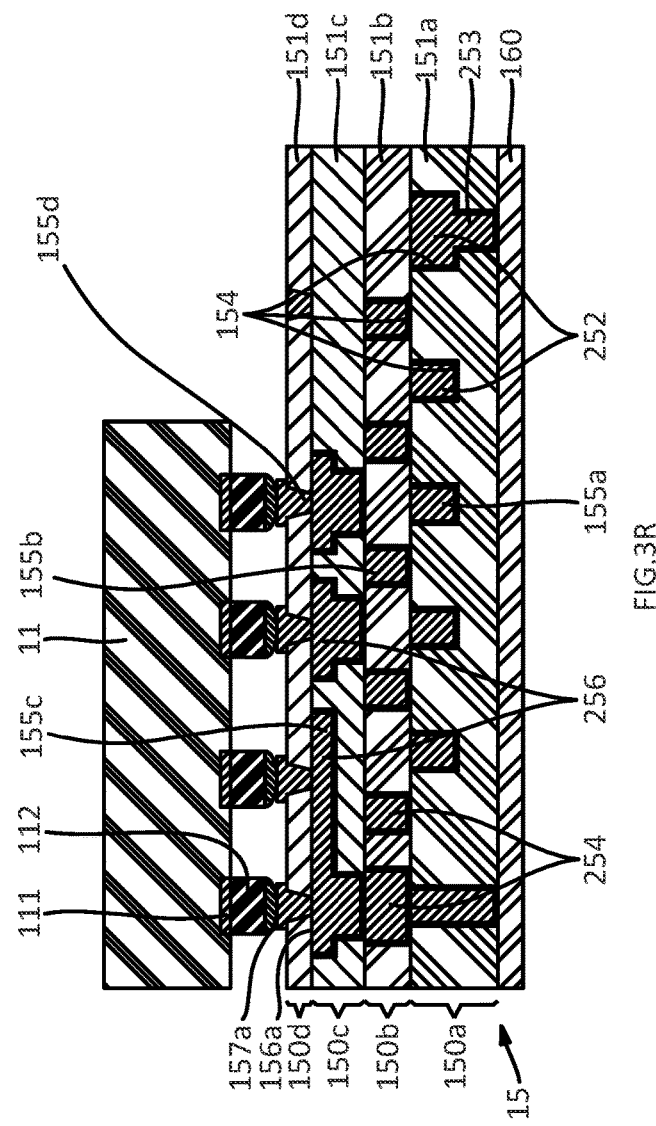

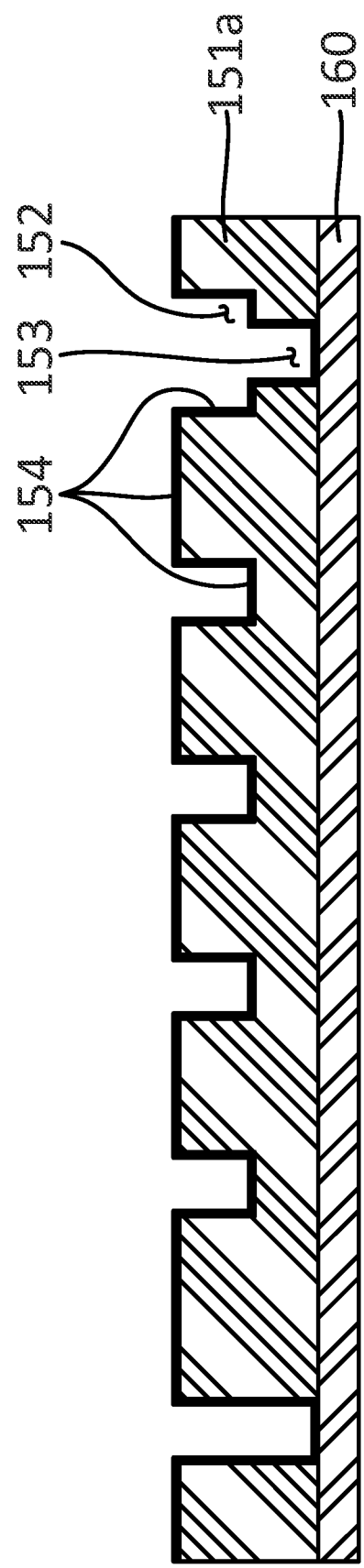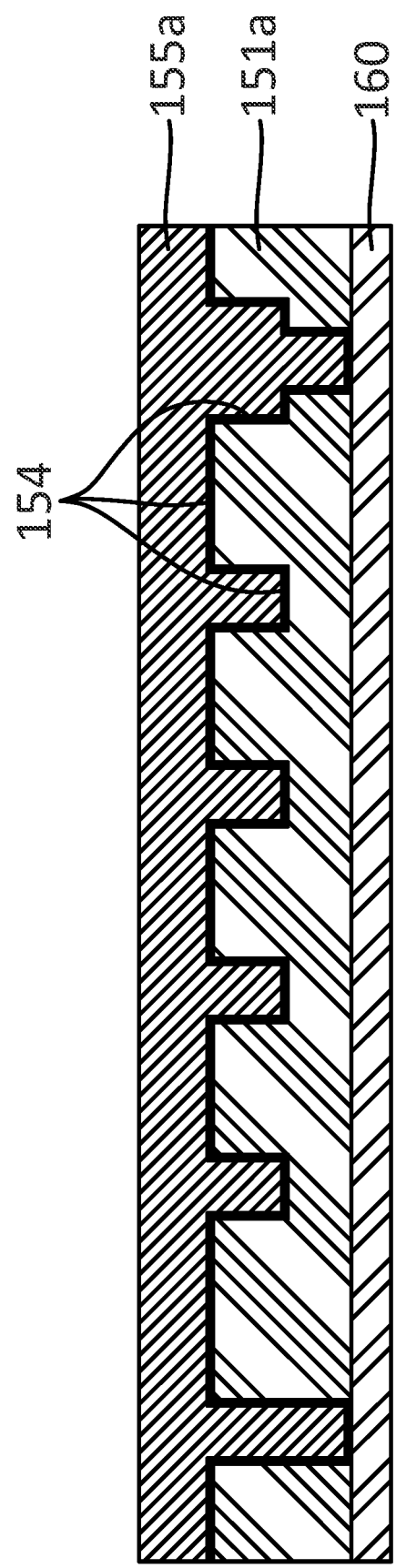
FIG.4E
FIG.4F

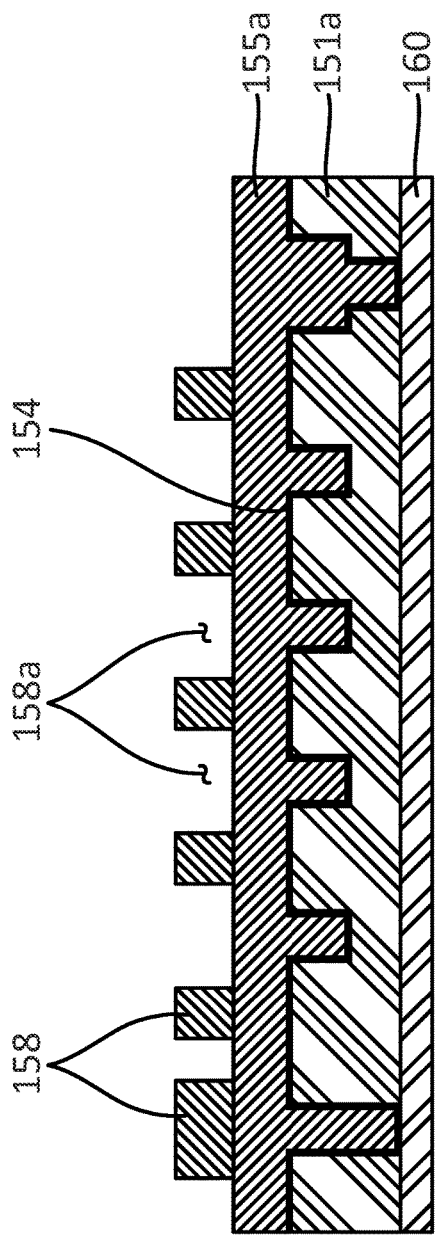
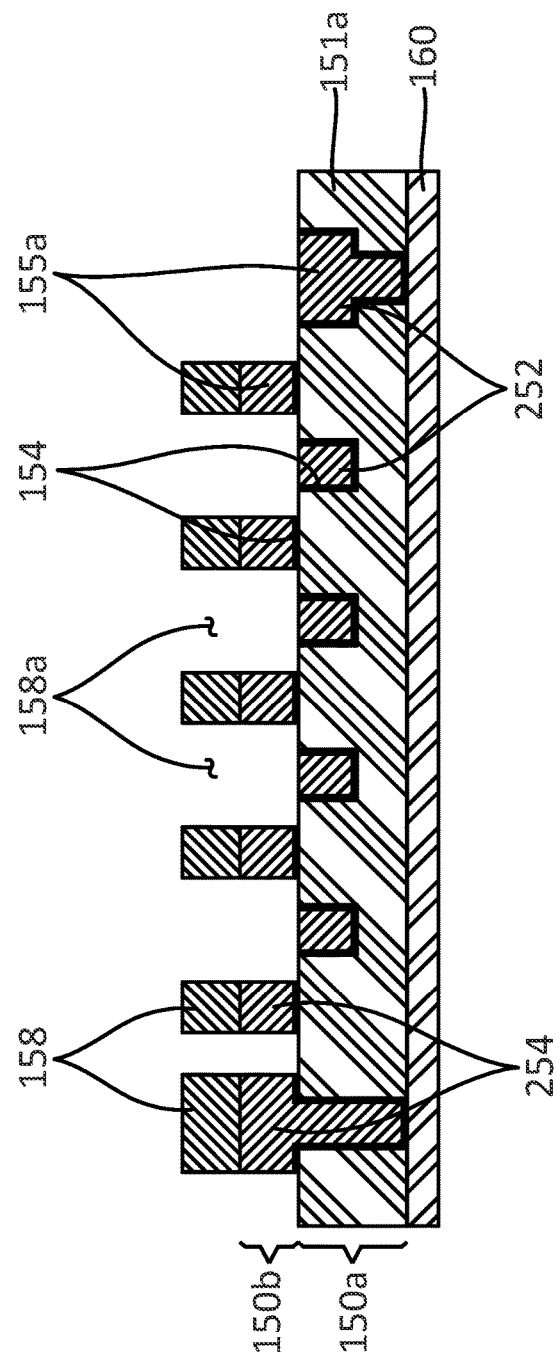

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2D show cross-sectional views of a dual damascene process for manufacturing the electronic device.

FIGS. 4A to 4I show cross-sectional views of another method for manufacturing the electronic device according to the example in FIG. 1.

Figure 1:
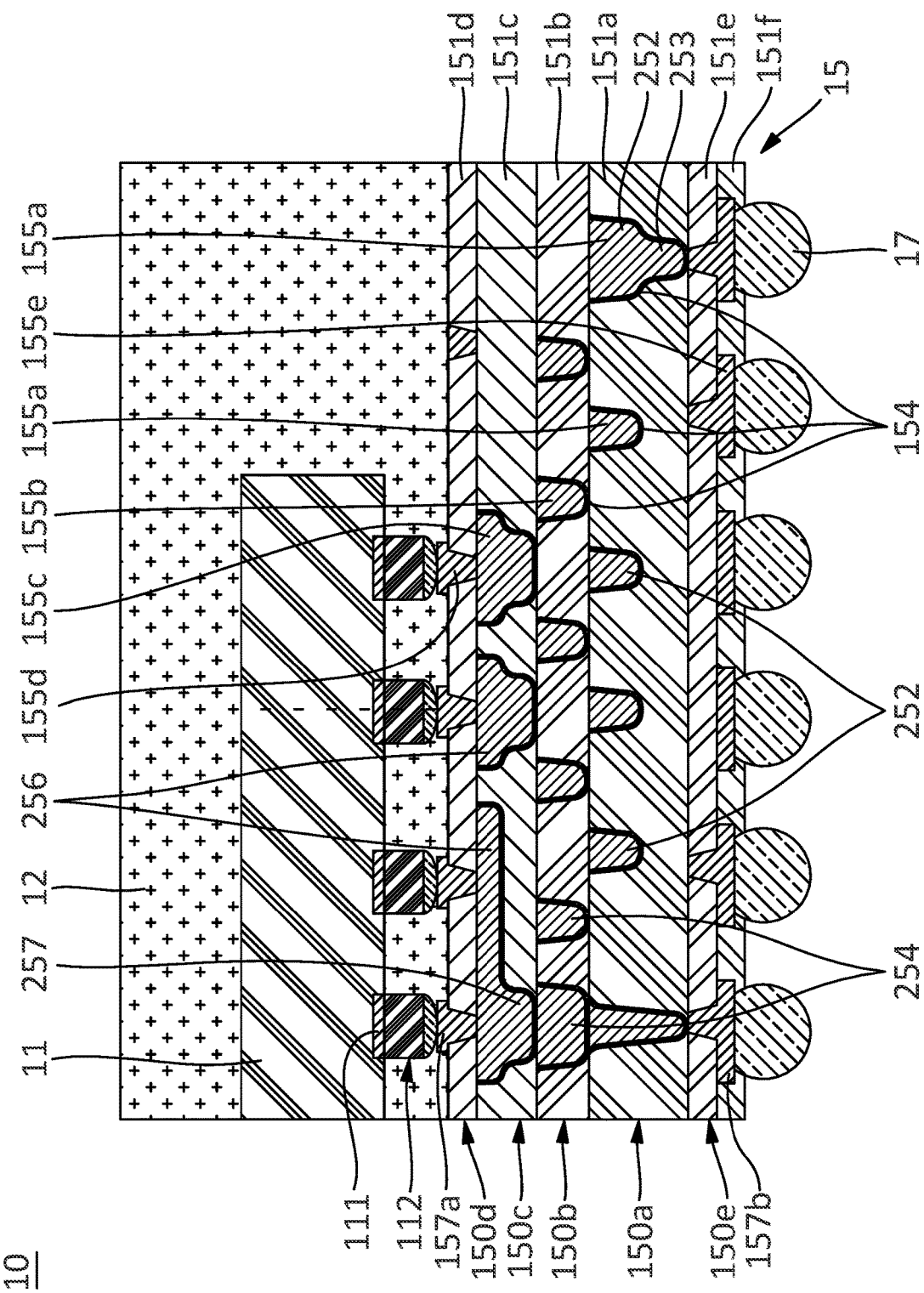
FIG. 1 shows a cross-sectional view of an electronic device according to an example.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, an electronic device comprises a substrate comprises a first dielectric having a top surface and a bottom surface, and a first conductor in the first dielectric and comprising a first via and a first trace over the first via. The first trace comprises a first trace sidewall and a first trace base, and the first via comprises a first via sidewall. The first conductor comprises a first arcuate vertex between the first trace sidewall and the first trace base, and a second arcuate vertex between the first via sidewall and the first trace base, an electronic component over the top surface of the substrate, and an encapsulant over the top surface of the substrate and contacting a lateral side of the electronic component.

In another example, a method to manufacture an electronic device comprises providing a first dielectric having a top surface and a bottom surface, providing a first trace pattern in the first dielectric from the top surface, wherein the first trace pattern defines a first trace comprising a first trace base, a first trace sidewall, and a first arcuate vertex between the first trace base and the first trace sidewall, providing a first via pattern in the first dielectric, wherein the first via pattern defines a first via comprising a first via sidewall and a second arcuate vertex between the first trace base and the first via sidewall, removing a portion of the first dielectric at the first trace pattern and the first via pattern to expose a first via opening and a first trace opening in the first dielectric, and providing a first conductive material in the first via opening and the first trace opening to provide a first conductor comprising the first trace and the first via.

In yet another example, a method to manufacture an electronic device comprises providing a first dielectric having a top surface and a bottom surface, and a first conductor in the first dielectric comprising a first via and a first trace over the first via, providing an electronic component over the top surface of the first dielectric, and providing an encapsulant over the top surface of the first dielectric and contacting a lateral side of the electronic component. The first trace comprises a first trace sidewall and a first trace base, and the first via comprises a first via sidewall, and the first conductor comprises a first arcuate vertex between the first trace sidewall and the first trace base, and a second arcuate vertex between the first via sidewall and the first trace base.

Other examples are included in the present disclosure. Such examples may be found in the figures, in the claims, and/or in the description of the present disclosure.

FIG. 1 shows cross-sectional view of an electronic device. In the example of FIG. 1, electronic device 10 can include electronic component 11, substrate 15, encapsulant 12, and connectors 17.

Electronic component 11 can comprise terminals 111 coupled to interconnects 112. Substrate 15 can comprise conductive structure 155 having conductors 155a, 155b, 155c, 155d, or 155e comprising one or more conductive layers or patterns that define conductive paths, traces, vias, internal terminals 157a, or external terminals 157b. Substrate 15 can comprise dielectric structure 151 comprising one or more dielectric layers defining dielectrics 151a, 151b, 151c, 151d, 151e, or 151f for providing structural integrity, separation, or insulation for conductive structure 155. In some examples, conductor 155a can be in dielectric layer 151a and can comprise via 253 and trace 252 over via 253. Substrate 15 can comprise one or more of the dielectric layers defining a top surface and a bottom surface with electronic component 11 over the top surface of substrate 15. Encapsulant 12 can be over the top surface of substrate 15 and can contact a lateral side of electronic component 12. Connectors 17 can be considered part of substrate 15, but can be optional in some implementations. Substrate 15 or connectors 17 can facilitate connection of electronic component 11 to an external device, such as a printed circuit board or another electronic or semiconductor component. Substrate 15, encapsulant 12, and connectors 17 can protect electronic component 11 from external factors and/or environmental exposure. In some examples, substrate 15 can be provided as a complete or nearly complete component or structure by first providing or manufacturing the elements of substrate 15. Electronic device 10 can then be manufactured by providing electronic component 11 and encapsulant 12 over the top surface of substrate 15, with encapsulant contacting a lateral side of electronic component 11.

In some examples, dielectric layer 151b can be over dielectric layer 151a. One or more traces 254 can be in dielectric layer 151b and can be offset from one or more traces 252 of dielectric layer 151a, for example in an offset pattern or arrangement, or an interleave pattern or arrangement. Multiple traces can be in the same dielectric layer, for example traces 252 can be in dielectric layer 151a, traces 254 can be in dielectric layer 151b, traces 256 can be in dielectric layer 151c, and so on. In some examples, a first trace 252 in dielectric layer 151a can be over via 253, and a second trace 252 in dielectric layer 151a can be offset from the first trace 252. A top side of the second trace 252 can be exposed from the top surface of dielectric layer 151a, and dielectric layer 151A can cover a base, for example base 151-t2 discussed below, of the second trace 252. In some examples, a trace 252 in dielectric layer 151b can be exposed from a top surface of dielectric layer 151b and can contact a top surface of dielectric layer 151b.

In some examples, trace 254 can be in dielectric layer 151b and via 253 can be in dielectric layer 151a wherein trace 254 contacts via 253, for example as shown on the left hand side of substrate 15 in FIG. 1. In some examples, dielectric layer 151c can be over dielectric layer 151a and can comprise conductor 155c comprising via 257 and trace 256 over via 257 having the same or similar sidewalls, vertices, or bases as trace 252 and via 253 of dielectric layer 151a as described herein.

Figure 2A:
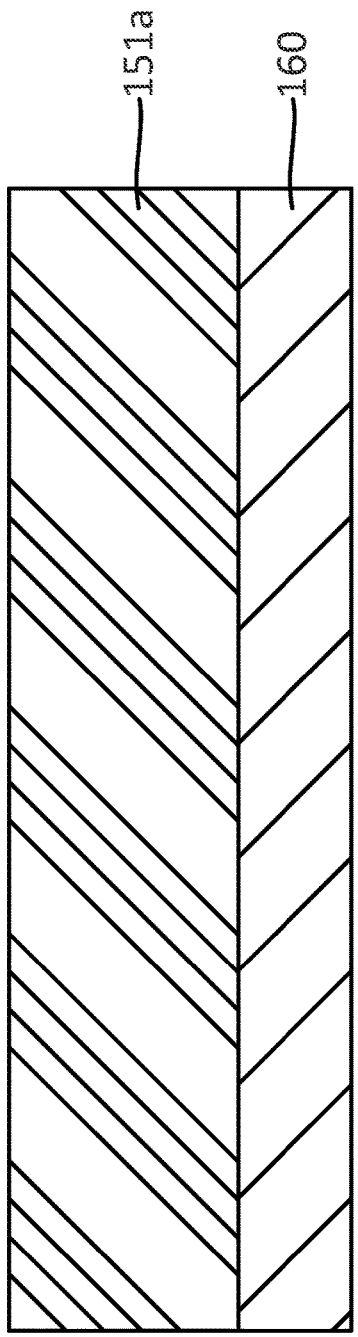

FIGS. 2A to 2D show cross-sectional views of a process for manufacturing the electronic device. FIG. 2A shows an initial stage of the manufacturing process.

In FIG. 2A, dielectric 151a can be provided on carrier 160. Carrier 160 can be a substantially planar plate. For example, carrier 160 can comprise or be referred to as a board, a wafer, a panel, a semiconductor, or a strip. In some examples, carrier 160 can comprise steel, stainless steel, aluminum, copper, ceramic, glass, or a wafer. Carrier 160 can have a thickness in a range from about 1 mm to about 3 mm and a width in a range from about 200 mm to about 450 mm.

Carrier 160 can function to handle concurrent formation of multiple electronic components 11. Carrier 160 can be commonly applied to some examples of this disclosure.

A top side and a bottom side of dielectric 151a can be substantially planar. In some examples, dielectric 151a can include phenolic resin, epoxy resin, glass epoxy, polyimide (PI), polyester, benzocyclobutene (BCB), poly benzoxazole (PBO), bismaleimide triazine (BT), silicone, an oxide layer ($SiO_2$), or a nitride layer ($Si_3N_4$). In some examples, dielectric 151a can have a photosensitive property.

Dielectric 151a can have a thickness capable of accommodating a trace and a via for providing a pattern. For example, dielectric 151a can have a thickness in a range from about 1 μm to about 50 μm. For example, dielectric 151a can be provided by a spin coating method or a spray coating method.

Figure 2B:
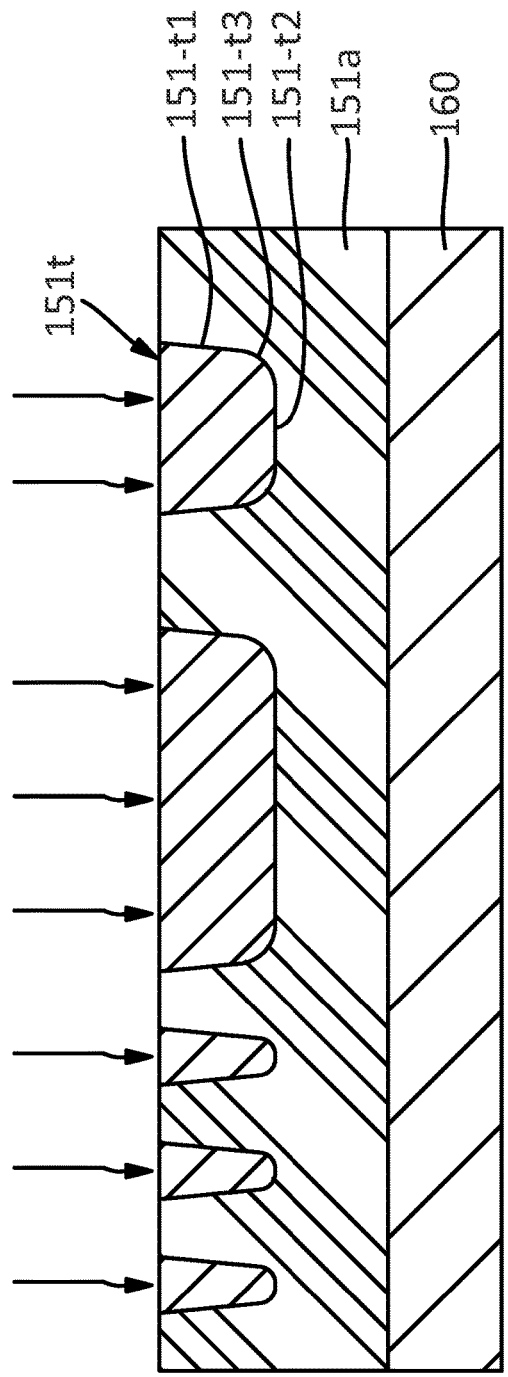

FIG. 2B shows a later stage of the manufacturing process. In the example of FIG. 2B, a trace pattern 151t can be provided on dielectric 151a. The trace pattern 151t can comprise a redistribution layer (RDL) pattern. A mask defining trace pattern 151t can be aligned over dielectric 151a and then irradiated with ultraviolet (UV) rays (UV light). The trace pattern 151t can be transferred by the mask onto dielectric 151a. In some examples, trace pattern 151t can have a thickness of about 20% to about 80% of a total thickness of dielectric 151a. For example, trace pattern 151t can have a thickness in a range from about 0.2 μm to about 40 μm. In some examples, the irradiation or development process of trace pattern 151t can produce sidewalls 151-t1 with curvature or slope, and vertex 151-t3 that is arcuate, rather than square or straight-line cornered, between sidewall 151-t1 and base 151-t2.

FIG. 2C shows a later stage of the manufacturing process. In the example of FIG. 2C, via pattern 151v can be provided on dielectric 151a. A mask defining via pattern 151v can be aligned over dielectric 151a and then irradiated with ultraviolet rays. The via pattern 151v can be transferred the mask onto dielectric 151a.

In some examples, via pattern 151v can have a thickness of about 20% to about 80% of a total thickness of dielectric 151a. For example, via pattern 151v can have a thickness in a range from about 0.2 μm to about 40 μm. In some examples, the irradiation or development process of via pattern 151v can produce sidewalls 151-v1 with curvature or slope, can produce vertex 151-v3 that is arcuate, between sidewall 151-v1 and base 151-v2, and can produce vertex 151-v4 that is arcuate, between via pattern 151v and trace pattern 151t. There can be examples where vertex 151-v3 can be square. Trace pattern 151t can merge with via pattern 151v, such that vertex 151-v4 merges sidewall 151-v1 of via pattern 151v with base 151-t2 or vertex 151-t3 of trace pattern 151t. In some examples sloped sidewalls 151t1 or 151v1, or arcuate vertex 151-t3, 151-v3, or 151-v4, can dissipate or diminish stress points that could otherwise form at junctions of flatter surfaces, or at square vertices of a trace or via, diminishing the probability of failure by stress cracking.

Ultraviolet rays for defining via pattern 151v can have an intensity greater than the ultraviolet rays for providing trace pattern 151t. For example, when the ultraviolet rays for exposing trace pattern 151t has an intensity of about 10, the ultraviolet rays for exposing the via pattern 151v has an intensity of about 20 or more, e.g., the intensity of the rays defining via pattern 151v can be double or more than the intensity for developing trace pattern 151t. Thus, via pattern 151v on dielectric 151a can be defined at a portion deeper than a depth where trace pattern 151t is defined. In some examples, via pattern 151v can be defined from a bottom side of trace pattern 151t to top side 160a of carrier 160. In some examples, the stages of FIGS. 2B and 2C can be concurrent, such as where the intensity of the rays defining trace pattern 151t and via pattern 151v are different.

FIG. 2D shows a later stage of the manufacturing process. In the example of FIG. 2D, the unnecessary portion of dielectric 151a removed, such as by development and curing. For example, trace opening 152 and via opening 153 can be defined by removing respective portions of dielectric 151a for trace pattern 151t and via pattern 151v using a developing solution. Trace opening 152 and via opening 153 can communicate or merge with each other. Via opening 153 can have a width less than that of trace opening 152.

After trace opening 152 and via opening 153 are provided, conductor 155a (FIG. 1) comprising a conductive material can be provided in trace opening 152 and via opening 153 to provide via 253 and trace 252 over via 253 (FIG. 1) having forms defined by trace opening 152 and via opening 153 in dielectric layer 151a. As a result, trace 252 can comprise trace sidewall 151-t1 and trace base 151-t2, and via 253 can comprise via sidewall 151-v1 and via base 151-v2. In some examples, conductor 155a can comprise an arcuate vertex 151-t3 between trace sidewall 151-t1 and trace base 151-t2, and another arcuate vertex 151-v4 between via sidewall 151-v1 and trace base 151-t2. In some examples, conductor 155a can comprise arcuate vertex 151-v3 between via base 151-v2 and via sidewall 151-v1. There can be examples where vertex 151-v3 can be square. In some examples, both trace 252 and via 253 can be in a single layer of dielectric material comprising dielectric layer 151a, for example as shown in FIG. 1. In some examples, trace 252 and via 253 can comprising a monolithic structure, for example as shown in FIG. 1. In some examples trace 252 can be exposed from a top surface of dielectric layer 151a, and via 253 can be exposed from a bottom surface of dielectric layer 151a.

The process described can permit simplification of manufacture for trace and via patterns. For example, in a regular dual-damascene process, a dielectric layer is first provided, then a via pattern then provided, then another dielectric layer is provided, and then a traced pattern is provided. As described for the present process in FIG. 2 however, the number of process steps can be reduced, and a process speed can increase. Both of the trace pattern 151t and the via pattern 151v are defined in dielectric 151a, without having to provide a second dielectric. In some examples, the process of FIG. 2 can be referred as a dual damascene process or a double exposure process. Also, a substrate manufactured by applying this process can be referred to as a double-exposure substrate or a dual-damascene substrate.

Figure 3A:
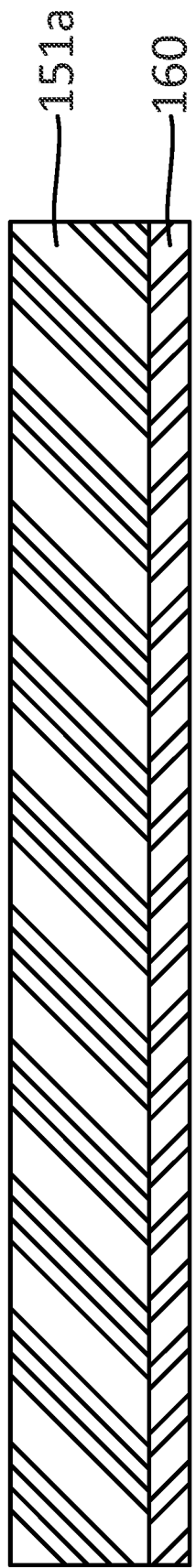
FIGS. 3A to 3X show cross-sectional views for manufacturing the electronic device according to the example in FIG. 1.
Figure 3B:
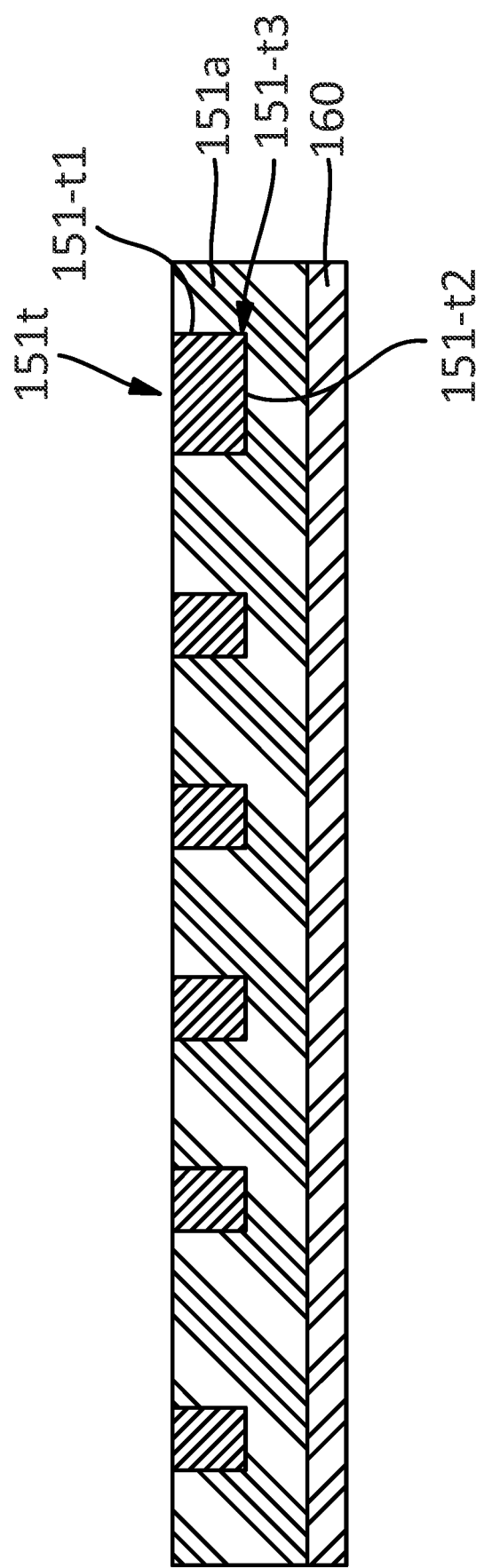
Figure 3C:
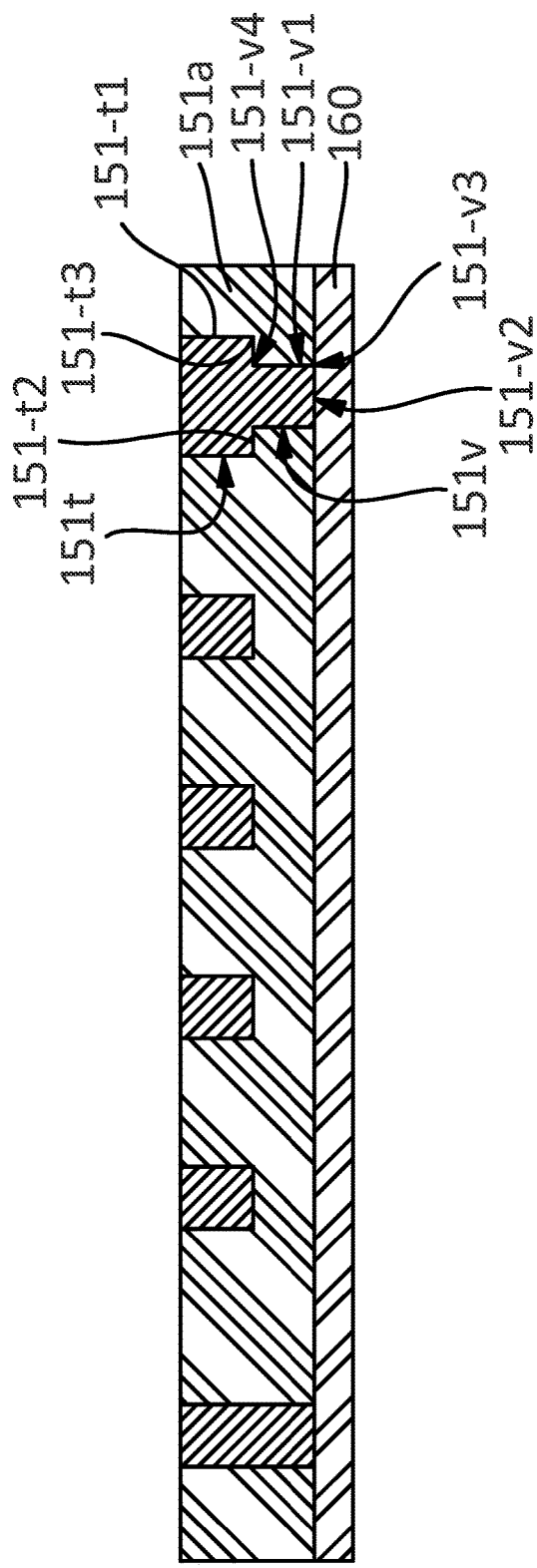
Figure 3D:
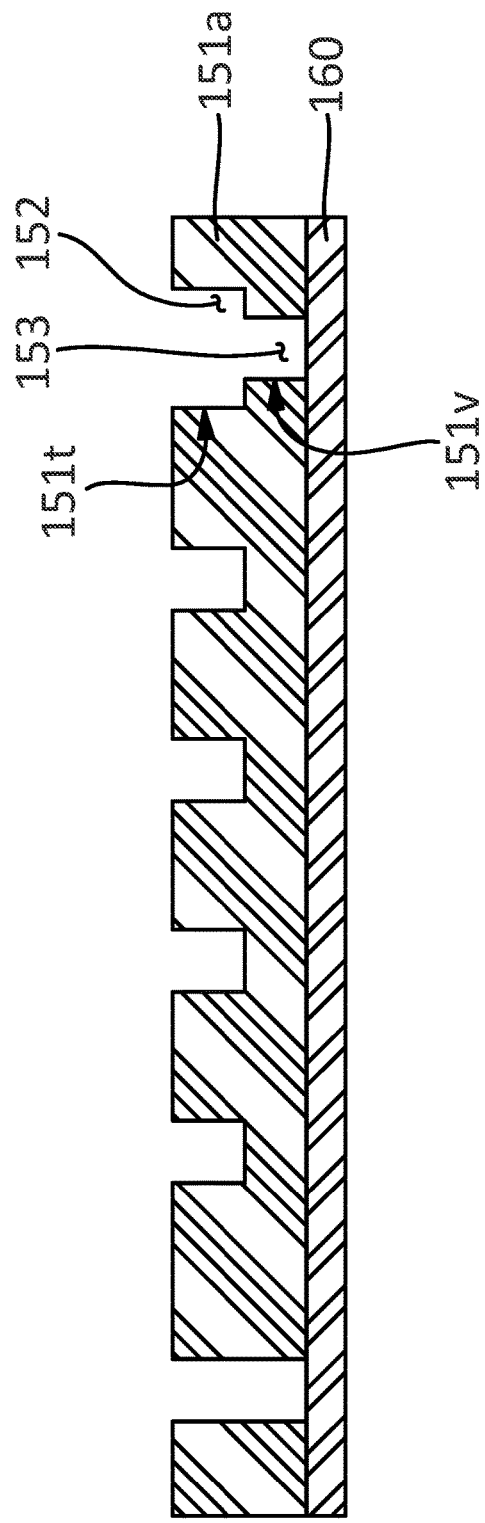
Figure 3I:
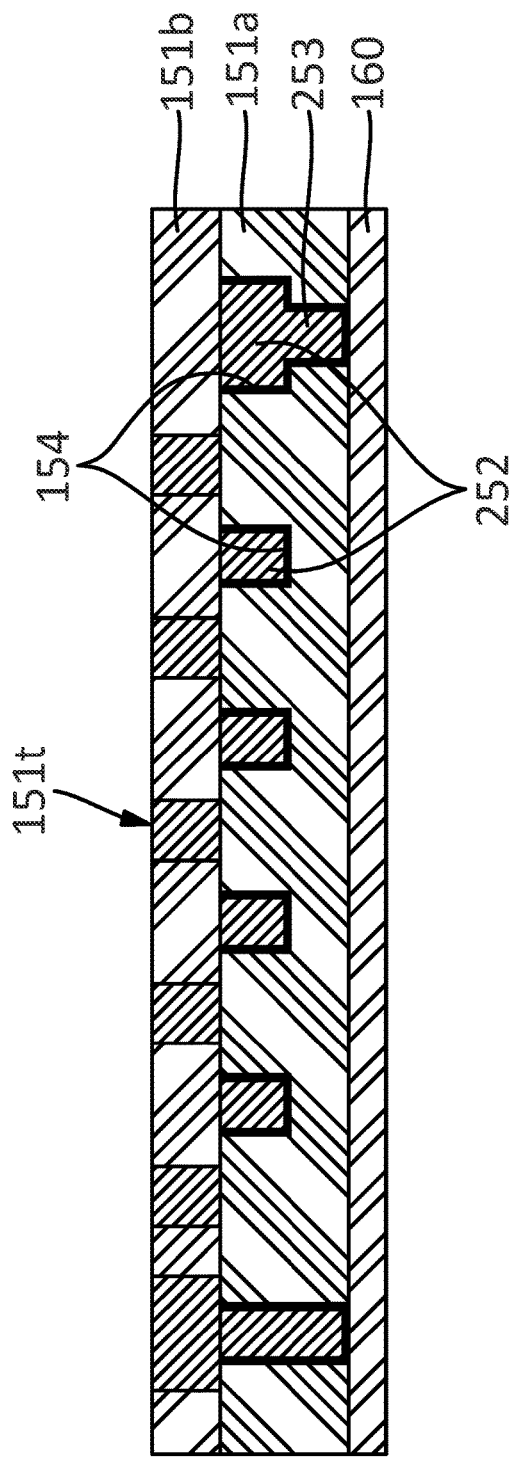
Figure 3J:
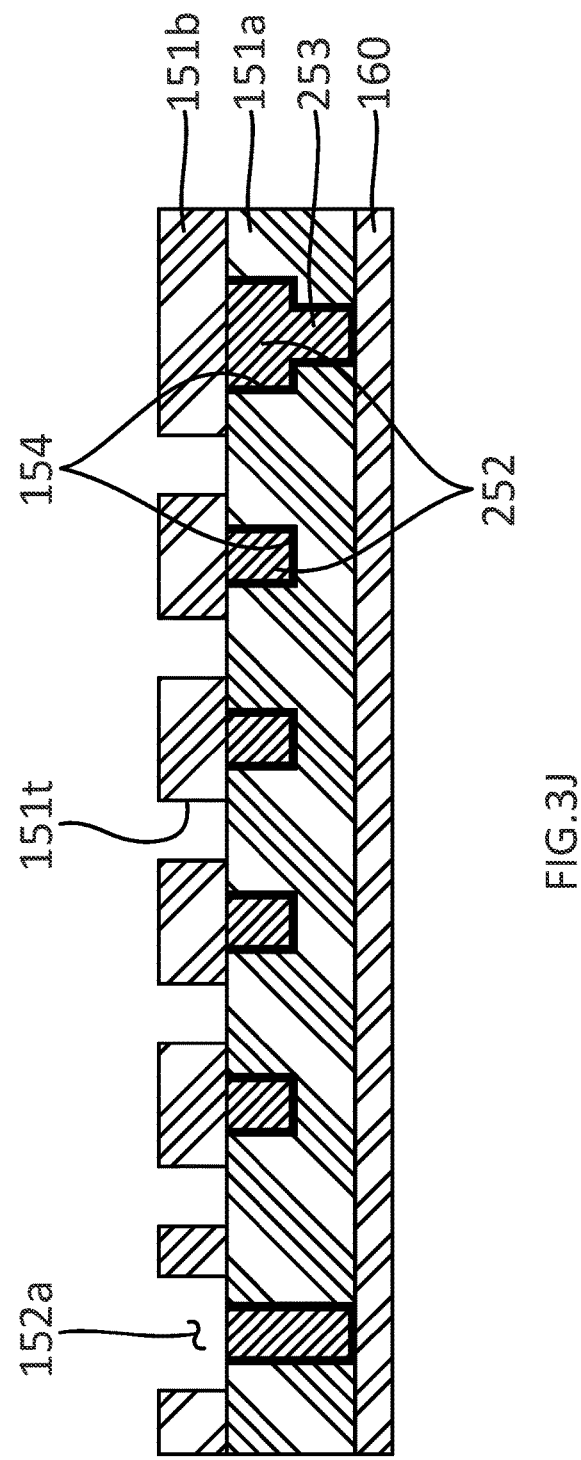
Figure 3S:
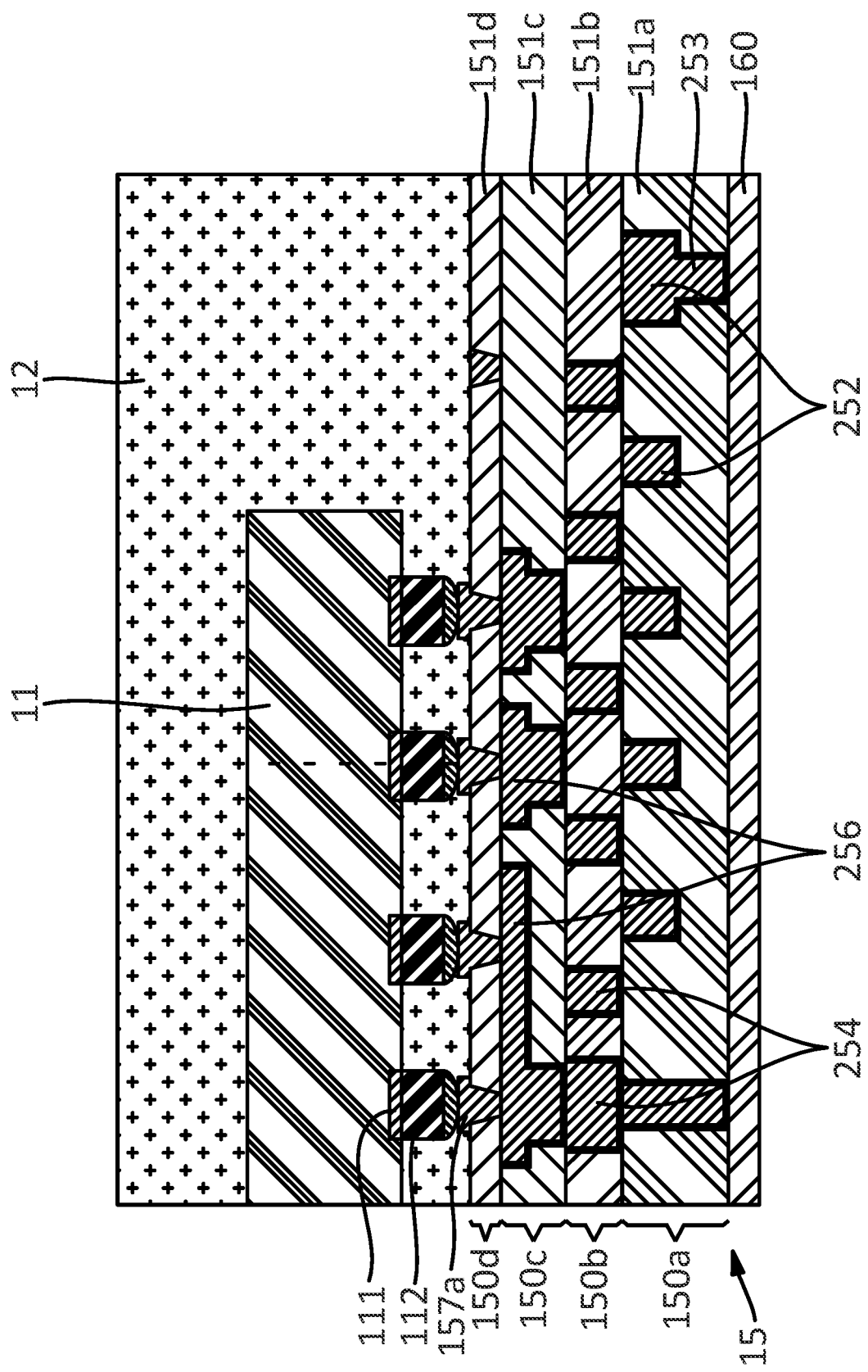
Figure 3T:
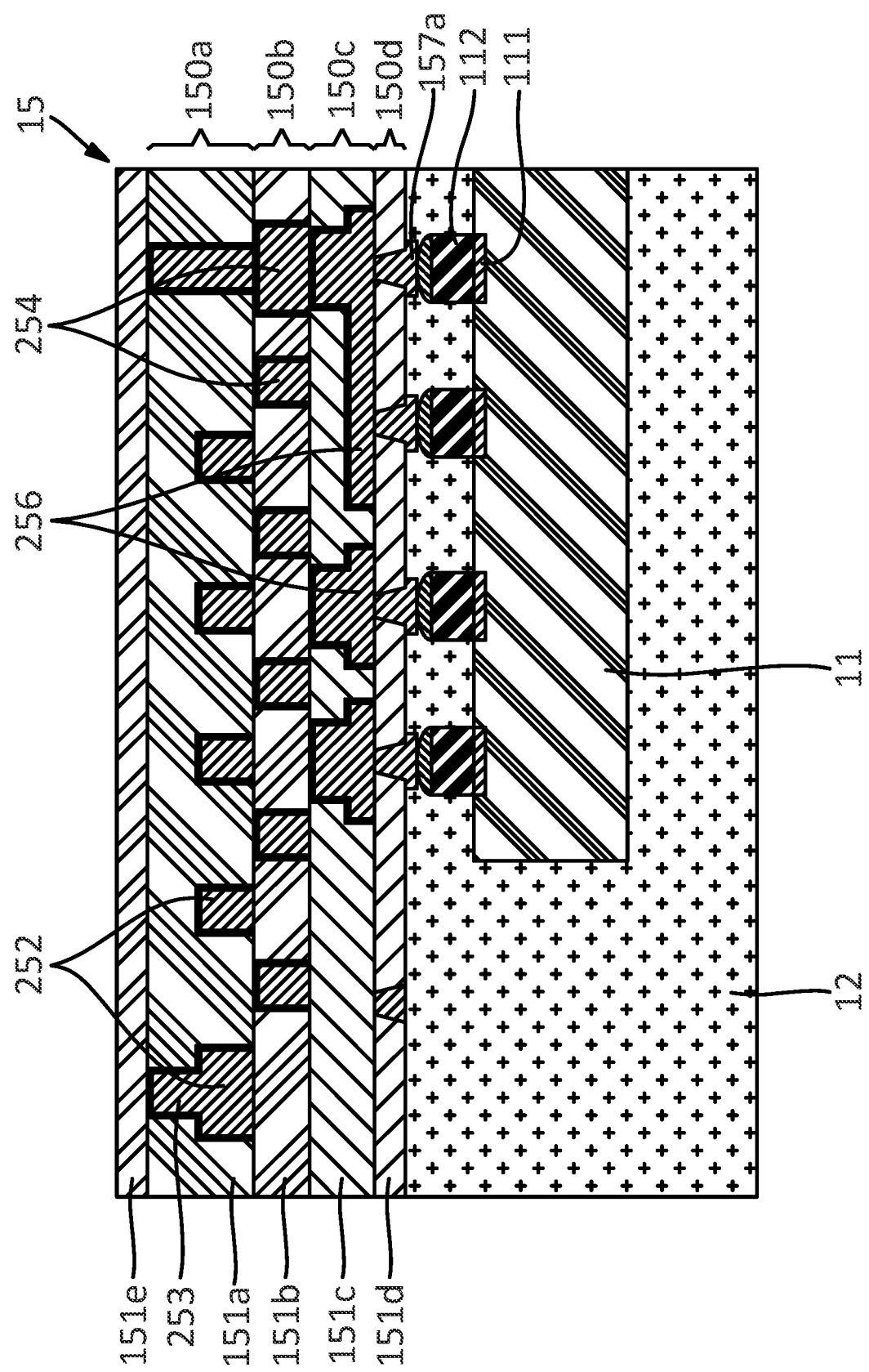
Figure 3U:
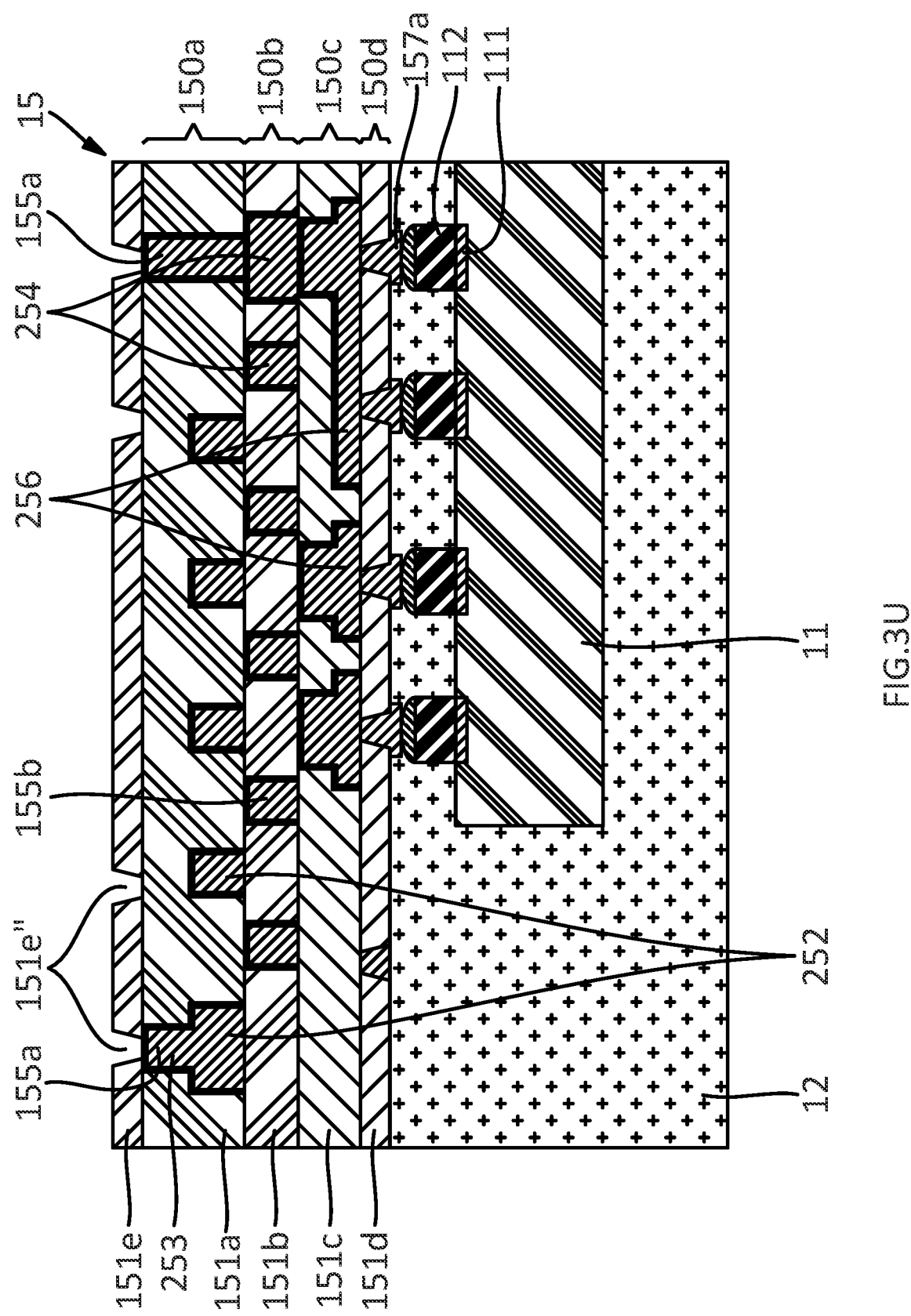
Figure 3V:
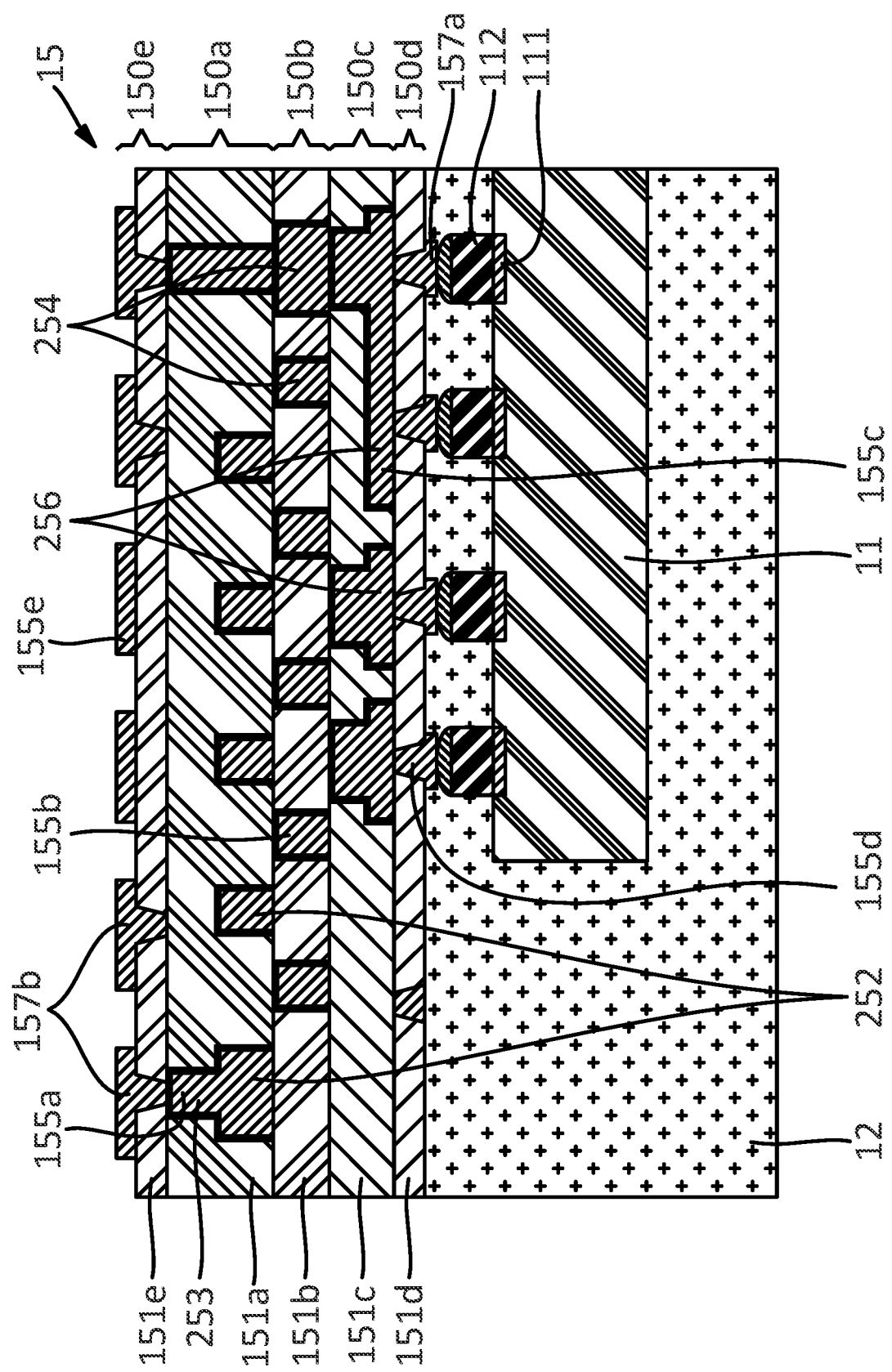
Figure 3W:
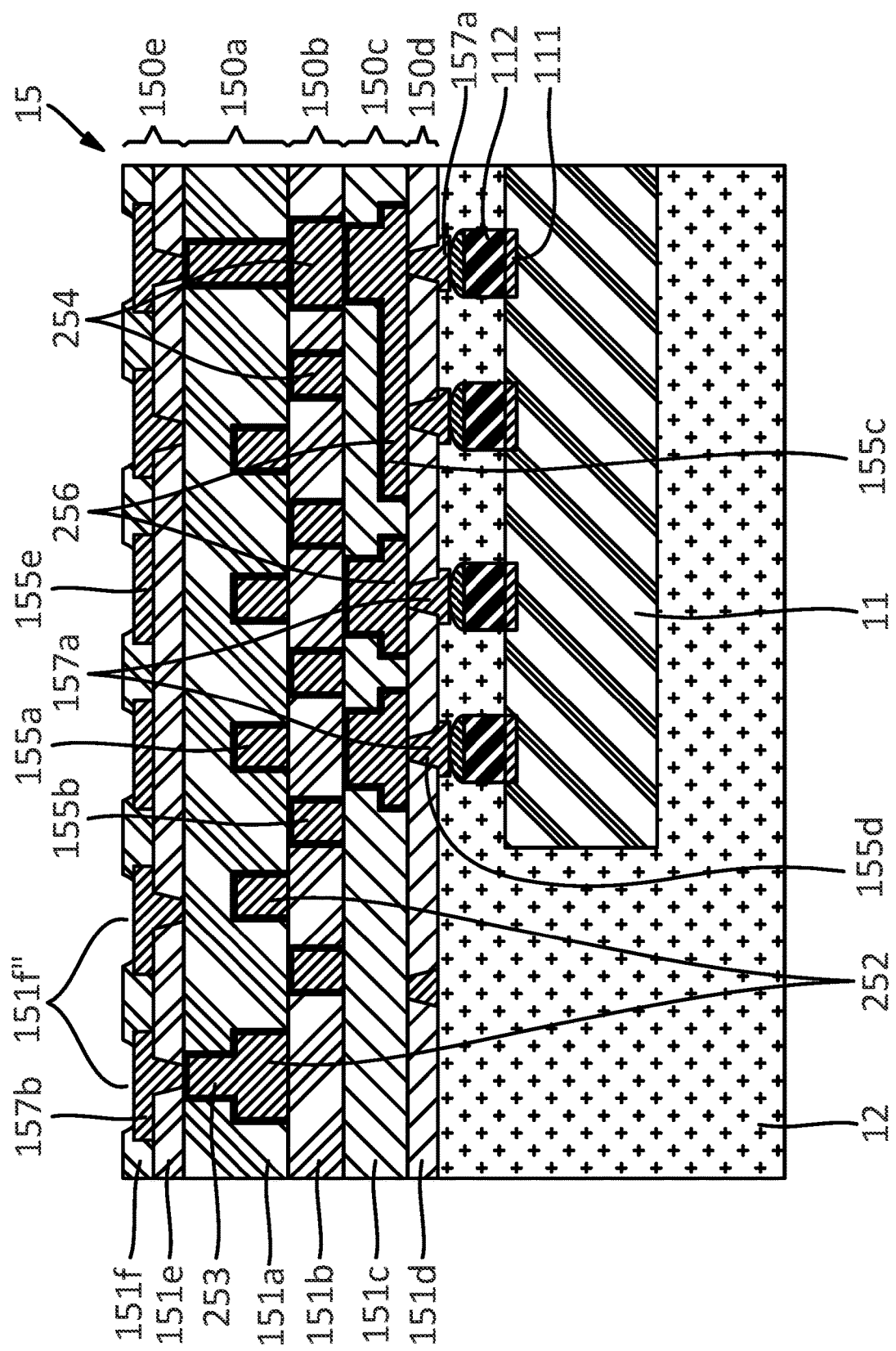
Figure 3X:
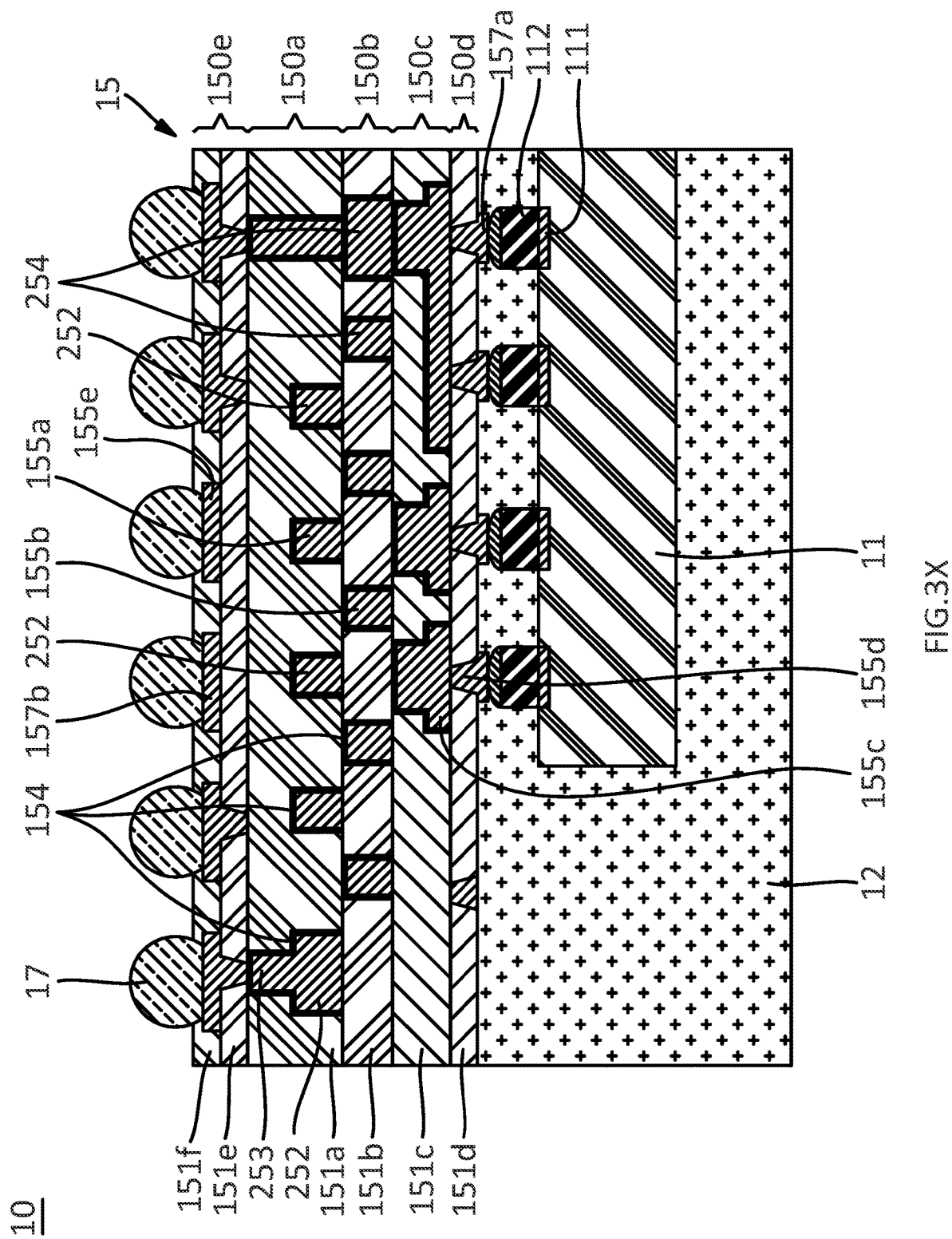

FIGS. 3A to 3X show cross-sectional views for manufacturing electronic device 10 according to the example of FIG. 1. A portion of the manufacturing process of FIG. 3 can comprise or be similar to the manufacturing process of FIG. 2.

FIGS. 3A to 3D present stages of manufacture leading to trace opening 152 and via opening 153 in dielectric 151a. In some examples the manufacturing stages, features, or elements of FIG. 3A to 3D can be correspondingly similar to or same as those described for the manufacturing stages of FIGS. 2A to 2D. For simplicity, contours are shown in FIG. 3 with straight surfaces and square vertices, but such contours can exhibit one or more corresponding sloped surfaces or arcuate vertices as respectively shown and described in FIG. 2.

FIG. 3E shows a later stage of the manufacturing process. In the example of FIG. 3E, seed 154 can be provided on dielectric 151a. In some examples, seed 154 can comprise one or more conductive layers, such as of titanium (Ti), titanium tungsten (TiW), nickel vanadium (NiV), or copper (Cu). For instance, one or more layers of Ti, TiW, NiV, or other can be deposited as, for example a barrier layer, and then a Cu layer can be deposited on top. Seed 154 can be provided by various methods including electroless plating, electroplating, and/or sputtering. In some examples, seed 154 can have a thickness in a range from about 0.01 μm to about 1 μm.

FIG. 3F shows a later stage of the manufacturing process. In the example of FIG. 3F, conductor 155a can be provided on seed 154 over dielectric 151a. For example, conductor 155a can comprise, define, or be referred to as one or more conductive layers, conductive structure, conductive material, redistribution layer (RDL), line patterns, conductive patterns, circuit patterns, or conductive paths. In some examples, conductor 155a can comprise one or more conductive materials such as copper, gold, or silver. Conductor 155a can be provided by various methods such as electroless plating, electroplating, and/or sputtering.

FIG. 3G shows a later stage of the manufacturing process. In the example of FIG. 3G, redistribution level 150a of substrate 15 can be established by removing conductor 155a above the top surface of dielectric 151a to define one or more traces 252. For example, a removal process of thinning, etching, or polishing, such as by chemical-mechanical polishing (CMP), can thin conductor 155a to expose the top side of dielectric 151a. The removal process defines trace 252 and via 253 in trace pattern 151t and via pattern 151v of dielectric 151a. A top side of trace 252 and a top side of dielectric 151 can be coplanar. In some examples, one or more traces 252 defined as described can be referred to as redistribution layer (RDL) traces.

FIGS. 3H to 3M show later stages of the manufacturing process. In the example of FIGS. 3H to 3M, redistribution level 150b (FIG. 3M) can be formed over redistribution level 150a. As seen in FIG. 3M, redistribution level 150b can comprise dielectric 151b, conductor 155b, and one or more traces 254, similar to dielectric 151a, conductor 155a, and one or more traces 252 of redistribution level 150a. In some examples, redistribution level 150b can also comprise one or more vias similar to one or more vias 253 of redistribution level 150a.

In some examples, the stages of FIGS. 3H to 3M for forming redistribution level 150b can be correspondingly similar to the stages described with respect to FIGS. 3A to 3G for forming redistribution level 150a. For instance, the FIG. 3H stage can be similar to the FIG. 3A stage, the FIG. 3I stage can be similar to the FIG. 3A to 3B stage, the FIG. 3J stage can be similar to the FIG. 3C stage, the FIG. 3K stage can be similar to the FIG. 3D stage, the FIG. 3L stage can be similar to the FIG. 3E stage, and the FIG. 3M stage can be similar to the FIG. 3F stage.

In FIG. 3H, dielectric 151 can be provided over redistribution level 150a, similar to as described with respect to dielectric 151a for FIG. 3A or 2A.

In FIG. 3I, trace pattern 151t can be provided in dielectric 151b, similar to as described with respect to trace pattern 151t in dielectric 151a for FIG. 3B or 2B. In some examples, via pattern 151v can be provided in dielectric 151b, similar to as described with respect to via pattern 151v in dielectric 151a for FIG. 3C or 2C.

In FIG. 3J, the unnecessary portion of dielectric 151b is removed, similar to as described with respect to the unnecessary portion of dielectric 151a for FIG. 3D or 2D.

In FIG. 3K, seed 154 can be provided on dielectric 151b, similar to as described with respect to seed 154 on dielectric 151a for FIG. 3E.

In FIG. 3L, conductor 155b can be provided on seed 154 over dielectric 151b, similar to as described with respect to seed 154 over dielectric 151a for FIG. 3F.

In FIG. 3M, redistribution level 150b of substrate 15 can be established by removing conductor 155b above the top surface of dielectric 151b to define one or more traces 254, similar to as described with respect to establishing redistribution level 150a by removing conductor 155a above the top surface of dielectric 151a to define one or more traces 252 for FIG. 3G.

As seen in FIG. 3M, one or more conductor 155b of redistribution level 150b can couple with one or more conductor 155a of redistribution level 150a. For instance, one or more trace 254 (or corresponding via) can couple with one or more trace 152.

In some examples, as seen in the cross-section view of FIG. 3M and the plan view of FIG. 3M1, traces 254 of redistribution level 150b can be arranged such that they alternate or interleave parallel with traces 252 of redistribution level 150a. To increase the density of RDL, more RDL lines or traces would need to be arranged in the same area. However, there is a limit to the RDL resolution. Also, there is a limit to making RDL lines, for example trace 254 and conductor 155b or trace 252 and conductor 155a of FIG. 3M, within a limited area. For example, if the RDL resolution limit is [2 μm line/2 μm space] where "line" corresponds to the width of trace 254 in FIG. 3M1, and where "space" corresponds to the interval between traces 254 in FIG. 3M1, the maximum number of parallel traces that can be arranged in a 30 μm space is 7. If, however, parallel traces of RDL of [2 μm line/4 μm space] are arranged interleaved with each other across two redistribution levels as shown in FIG. 3M, then 9 parallel traces can be routed within the same 30 μm space. In such case, the same effect of RDL [2 um line/1 um space] is achieved while using RDL of [2 μm line/4 μm space]. Through such interleaved arrangement, the RDL density may be increased or improved by about 30%.

Additional stages can be performed to provide further redistribution levels for substrate 15. In some examples, the additional stages can provide conductive paths or under bump metallization (UBM).

FIG. 3N shows a later stage of the manufacturing process. In the example of FIG. 3N, redistribution level 150c can be defined by forming dielectric 151c and conductor 155c, with corresponding traces 256 or vias 257, on dielectric 151b by, for example, stages similar to those described with respect to FIGS. 3A to 3G for dielectric 151a and conductor 155a, with corresponding traces 252 or vias 253, of redistribution level 150a.

FIG. 3O shows a later stage of the manufacturing process. In the example of FIG. 3O, dielectric 151d can be provided over redistribution level 150c, on top side of conductor 155c, and top side of dielectric 151c. In some examples, dielectric 151d can be similar to dielectric 151a. In some examples, dielectric 151d can comprise of be referred as a solder mask. In some examples, dielectric 151d can include an electrical insulation material such as a polymer, polyimide (PI), benzocyclobutene (BCB), polybenzoxazole (PBO), bismaleimide triazine (BT), a molding material, a phenolic resin, an epoxy, silicone, or an acrylate polymer. In some examples, dielectric 151d can be provided by various methods such as spin coating, spray coating, printing, PVD, CVD, MOCVD, ALD, LPCVD, or PECVD. In some examples, dielectric 151d can have a thickness in a range from about 1 μm to about 50 μm.

FIG. 3P shows a later stage of the manufacturing process. In the example of FIG. 3P, opening 151d" exposing trace 256 can be provided in dielectric 151d. For example, opening 151d" can be provided by etching, laser ablation, or by a photolithographic process. Dielectric 151d can expose top side of trace 256 through opening 151d".

FIG. 3Q shows a later stage of the manufacturing process. In the example of FIG. 3Q, redistribution level 150d can be established by defining internal terminal 157a from conductor 155d, covering top side of trace 256 exposed through opening 151d". In some examples, internal terminal 157a can be provided by using a photomask and a mask pattern. Internal terminal 157a can be connected to trace 256 through opening 151d". Internal terminal 157a can comprise or be referred to as a conductor, a conductive material, a conductive layer, a redistribution layer (RDL), a line pattern, a trace pattern, or a circuit pattern, a pad, or an under-bump metallization. Internal terminal 157a can be comprise one or more conductive materials, for example copper, gold, or silver. Internal terminal 157a can be provided by various methods, for example sputtering, electroless plating, electroplating, PVD, CVD, MOCVD, ALD, LPCVD, or PECVD. In some examples, internal terminal 157a can have a thickness in a range from about 1 μm to about 100 μm.

In some examples, such as described in FIGS. 1 to 3, substrate 110 can be a redistribution layer ("RDL") substrate. RDL substrates can comprise one or more conductive redistribution layers and one or more dielectric layers that (a) can be formed layer by layer over an electronic device where the RDL substrate is to be coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photomask material to form a photolithographic mask. The dielectric layers of the RDL substrate can be patterned with a photo-patterning process, and include a photolithographic mask where light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or silicon oxynitride (SiON). The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

In other implementations, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process.

FIG. 3R shows a later stage of the manufacturing process. In the example of FIG. 3R, electronic component 11 can be coupled with internal terminal 157a of substrate 15. In some example, electronic component 11 can include component terminal 111 and component interconnect 112.

In the example of FIG. 3R, electronic component 11 can be coupled to component interconnect 112 through component terminal 111. Electronic component 11 can comprise or be referred to as a semiconductor die, a semiconductor device, or a semiconductor chip. In some examples, electronic component 11 can comprise an integrated circuit, a logic die, a micro-control unit, a memory, a digital signal processor, a network processor, a power management unit, an audio processor, a RF circuit, an antenna structure, a micro-electro-mechanical (MEMS) device, or a wireless baseband system processor. In some examples, electronic component 11 can have a thickness in a range from about 30 μm to about 800 μm. In some example, multiple different electronic components 11 having same or different features or functionalities can be coupled to substrate 15.

In the example of FIG. 3R, at least one component terminal 111 can be provided on a bottom side of electronic component 11. Component terminal 111 can be an input or output terminal, or a power terminal, of electronic component 11. Component terminal 111 can be coupled with component interconnect 112. In some examples, component terminal 111 can be referred to as a die pad or a bond pad. In some examples, component terminal 111 can comprise a conductive material such as aluminum, copper, aluminum alloy, or copper alloy. Component terminal 111 can have a width in a range from about 10 μm to about 100 μm. Component terminal 111 can have a thickness in a range from about 1 μm to about 50 μm.

In the example of FIG. 3R, component interconnect 112 can be provided on component terminal 111. Component interconnect 112 can be coupled with electronic component 11 through component terminal 111. Component interconnect 112 can be coupled with top side of internal terminal 157a. In some examples, component interconnect 112 can be provided by one or more of a ball-drop method, a screen printing method, or an electroplating method. In some examples, component interconnect 112 can comprise or be referred to as, a conductive ball, a solder ball, a conductive post or pillar, or a solder-capped conductive post or pillar. In some examples, component interconnect 112 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, component interconnect 112 can have a size in a range from about 0 mm to about 0.1 mm.

FIG. 3S shows a later stage of the manufacturing process. In the example of FIG. 3S, encapsulant 12 can cover electronic component 11, internal terminal 157a, and substrate 15. In some examples, encapsulant 12 can comprise or be referred to as, an epoxy molding compound, an epoxy molding resin, or a sealant. In some examples, encapsulant 12 can comprise or be referred to as, a molding part, a sealing part, an encapsulation part, a protection part, a package, a lid, or a body. In some examples, encapsulant 12 can be provided by a compression molding method, a transfer molding method, a liquid encapsulant molding method, a vacuum lamination method, a paste printing method, or a film assist molding method. In some examples, encapsulant 12 can comprise a metallic material such as a lid that covers electronic component 111, or such as a conformal metallic material that conforms to the outer sides of the body of encapsulant 12. In some examples, encapsulant 12 can have a thickness in a range from about 0.03 μm to about 1 μm. Encapsulant 12 can protect electronic component 11 and internal terminal 157a from an external factor or an external environment by covering electronic component 11 and internal terminal 157a. After encapsulant 12 is provided, carrier 160 can be removed and the assembly can be flipped.

FIG. 3T shows a later stage of the manufacturing process, with the assembly flipped from FIG. 3S and with carrier 160 removed. In FIG. 3T, dielectric 151e can be provided on redistribution level 150a of substrate 15, similar to as described with respect to dielectric 151d for FIG. 3O.

In FIG. 3U, openings 151e" can be provided through dielectric 151e to expose portions of conductors 155a of redistribution level 150a, similar to as described with respect to openings 151d" through dielectric 151d exposing portions of conductors 155c of redistribution level 150d for FIG. 3P.

In FIG. 3V, redistribution level 150e can be established by conductors 155e defining external terminals 157b coupled to the exposed portions of conductors 155a through openings 151e" of dielectric 151e, similar to as described with respect to internal terminals 157a coupled to the exposed portions of conductors 155c through openings 151d" of dielectric 151d for FIG. 3Q.

In FIG. 3W, dielectric 151f can be provided on redistribution level 151e, with openings 151f" exposing portions of external terminals 157b. In some examples, dielectric 151f can be similar to dielectric 151d in terms of material, features, or formation.

FIG. 3X shows a later stage of the manufacturing process. In the example of FIG. 3X, external interconnect 17 can be connected to external terminal 157b. External interconnect 17 can be coupled with electronic component 11 through substrate 15. In some examples, external interconnect 17 can be provided by a ball-drop method, a screen printing method, or an electroplating method. In some examples, external interconnect 17 can comprise or be referred to as a conductive ball, a solder ball, or a conductive bump. In some examples, external interconnect 17 can have a size in a range from about 0.1 mm to about 1 mm. With external interconnect 17 is provided, substrate 15 can be flipped to provide the electronic device 10.

FIGS. 4A to 4I show cross-sectional views for another manufacturing process for electronic device 10 according to the example in FIG. 1. Portions of the manufacturing process of FIG. 4 can comprise or bi similar to the manufacturing process or FIG. 2 or 3.

FIGS. 4A to 4E present stages of manufacture leading to trace opening 152 and via opening 153 in dielectric 151a, covered by seed 154. The manufacturing stages, features, or elements of FIG. 4A to 4ED can be correspondingly similar to or same as those described for the manufacturing stages of FIGS. 3A to 3E, or FIGS. 2A to 2D. For simplicity, contours are shown in FIG. 4 with straight surfaces and square vertices, but such contours can exhibit one or more corresponding sloped surfaces or arcuate vertices as respectively shown and described in FIG. 2.

FIG. 4F shows a later stage of the manufacturing process. In the example of FIG. 4F, conductor 155a can be provided on seed 154 over dielectric 151a. The manufacturing stage, features, or elements of FIG. 4F can be similar to those described for the stage of FIG. 3F. In some examples, the thickness of conductor 155a in FIG. 4F can be greater than the thickness of conductor 155a in the stage of FIG. 3F.

In the previous example of FIGS. 3F to 3G, the portion of conductor 155a above the top side of dielectric 151a is removed. In the present example of FIG. 4, as will be described below, part of conductor 155a above the top side of dielectric 151a can be processed to remain and provide an additional redistribution pattern or redistribution level that comprising traces 254 out of the same conductor 155a that provides traces 252.

FIG. 4G shows a later stage of the manufacturing process. In the example of FIG. 4G, photomask 158 can be provided on conductor 155a and then exposed by placing a mask thereon to transfer a predetermined pattern. In some examples, photomask 158 can be provided by a spin coating method, spray coating method, dip coating method. A portion of photomask 158 can be developed and removed to define openings 158a. The remaining portion of photomask 158 can serve as a pattern for defining the additional redistribution pattern including traces 254.

FIG. 4H shows a later stage of the manufacturing process. In the example of FIG. 4H, portions of conductor 155a and of seed 154 corresponding to openings 158a of photomask 158 can be removed, such as by etching. Portions of conductor 155a covered by photomask 158 and defining vias 253, traces 252, and traces 254 can remain. Accordingly, redistribution patterns of redistribution level 150a and of redistribution level 150b can be defined out of the same conductor 155a without need to add an additional conductor layer.

Figure 4A:
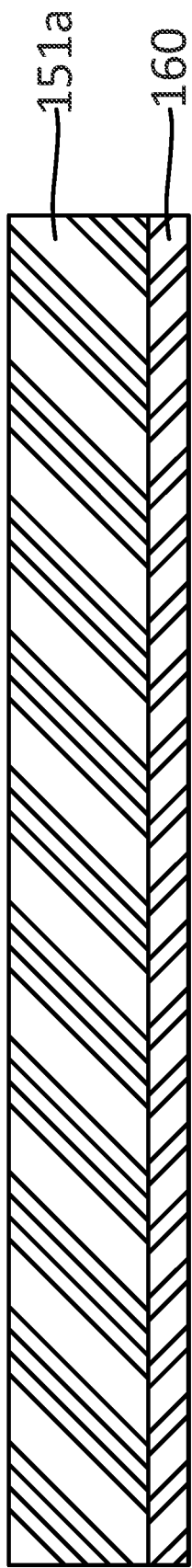
Figure 4B:
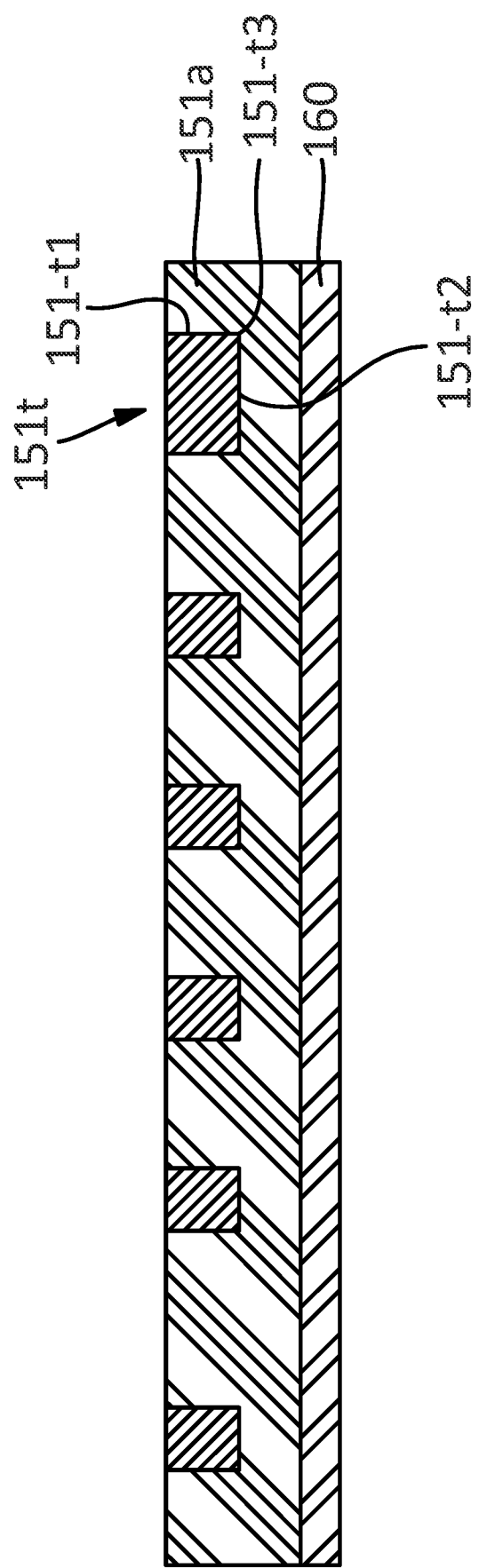
Figure 4C:
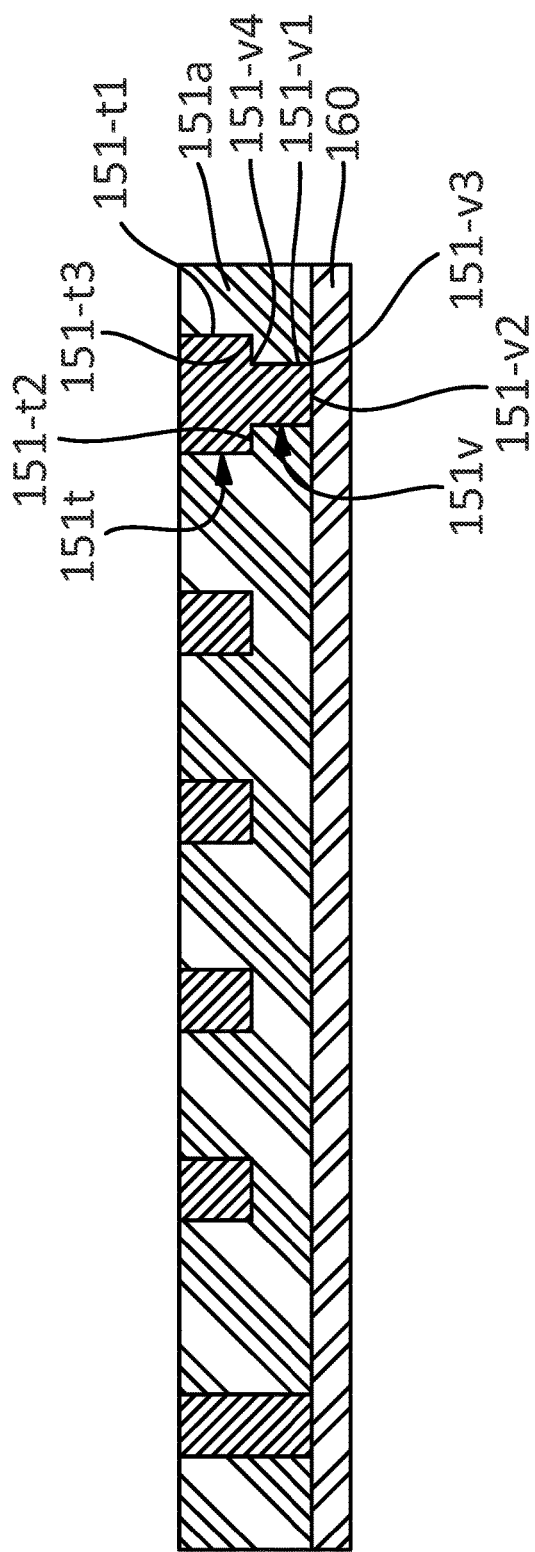
Figure 4D:
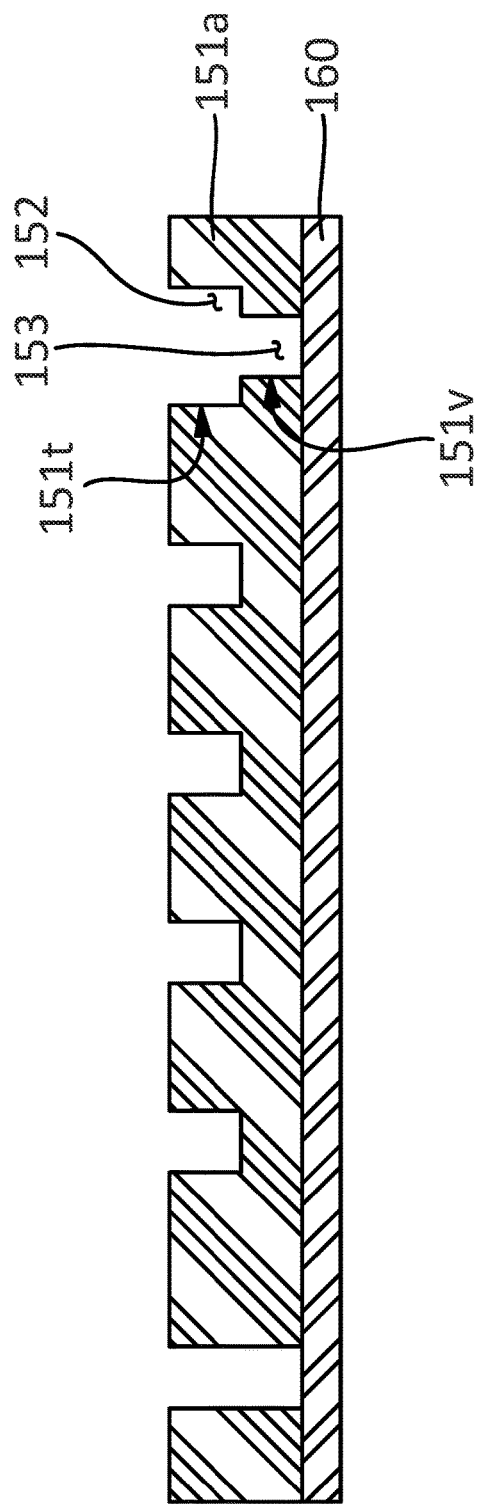
Figure 4I:
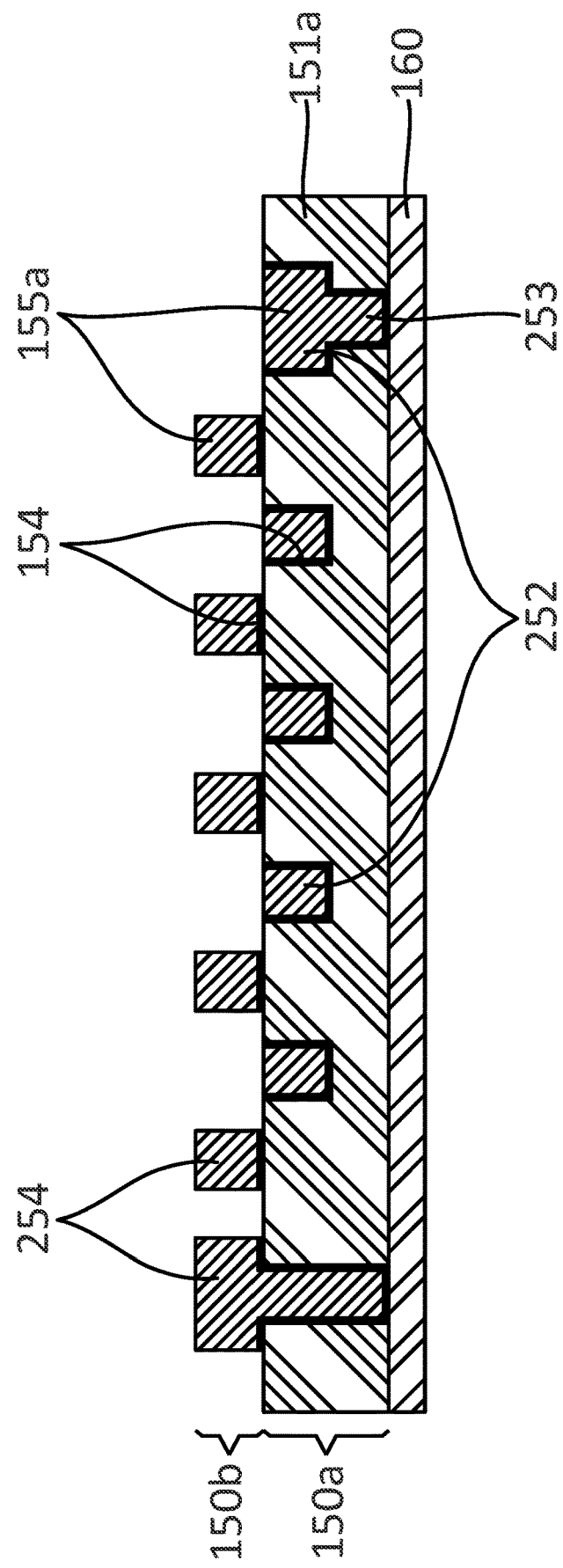

FIG. 4I shows a later stage of the manufacturing process. In the example of FIG. 4I, remaining photomask 158 can be removed. In some examples, a dielectric like dielectric 151b can be provided around traces 254 as part of redistribution level 150b.

Additional process stages can be performed after the manufacturing stages of FIGS. 4A to 4I. In some examples, the additional stages can provide corresponding processes, elements, or features similar or same as those described for FIGS. 3N to 3W. Through the above-described manufacturing stages, electronic device 10 in FIG. 1 can be provided.

Figure 5:
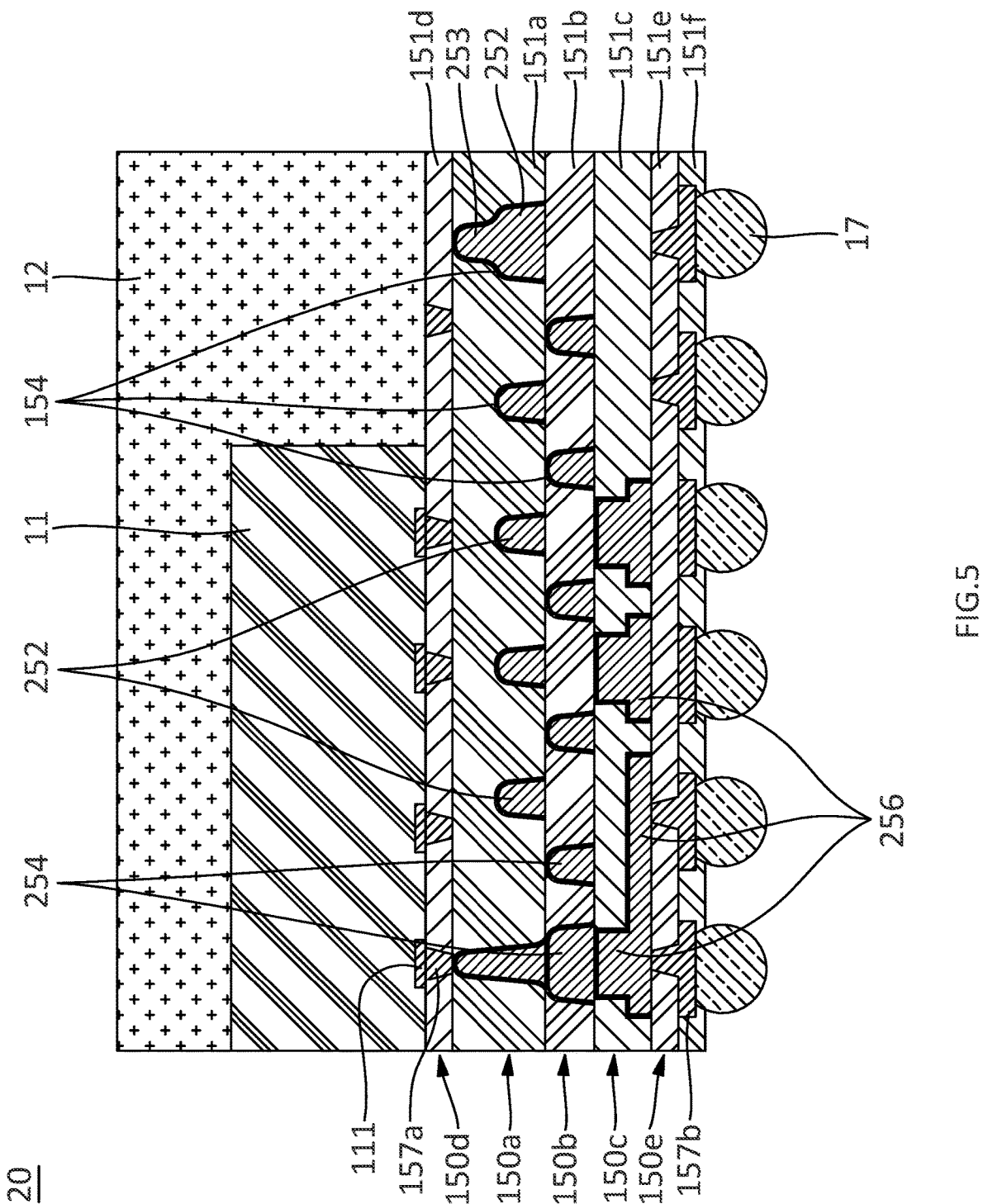
FIG. 5 show a cross-sectional view of an electronic device according to an example.

FIG. 5 shows a cross-section illustrating electronic device 20. Features, elements, and manufacturing of electronic device 20 can be similar to those described above with respect to electronic device 10.

In the example of FIG. 5, the orientation of substrate 15 can be inverted from that shown in FIG. 1 for electronic device 10. Further, substrate 15 can be formed over electronic component 11 and encapsulant 12. FIG. 5 shows component interconnects 112 omitted, but there can be examples where component interconnects 112 can remain, coupled to component terminals 111 and bounded by encapsulant 12, as part of electronic device 20.

In some examples, electronic component 11 can be provided on a carrier. Encapsulant 12 can be provided on the carrier and around electronic component 11. In some examples, with encapsulant 12 in place, the carrier can be removed. Component terminals 111 or component interconnects 112 can be exposed from encapsulant 12, such as by removal of the carrier or by grinding a portion of encapsulant 12.

Dielectric 151d can be formed on electronic component 11 and encapsulant 12. Dielectric 151d can be patterned to expose component terminals 111 or component interconnects 112. In some examples, dielectric 151d can be optional.

Substrate 15 can be formed on electronic component 11 and encapsulant 12 (instead of on carrier 160) according to the processing stages described for FIGS. 2A to 2D, FIGS. 3A to 3N, or FIGS. 4A to 4I. Substrate 15 and electronic device 20 can then be finalized according to the processing stages described for FIGS. 3T to 3X.

The present disclosure includes reference to certain examples. It will be understood by those skilled in the art, however, that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

What is claimed is:
1. An electronic device, comprising:
   a substrate, comprising:
      a first dielectric having a top surface and a bottom surface, wherein the first dielectric comprises a single layer of dielectric material, and a first conductor in the first dielectric and comprising a first via and a first trace over the first via,
wherein the first trace comprises a first trace sidewall and a first trace base, and the first via comprises a first via sidewall, and
wherein the first conductor comprises a first arcuate vertex between the first trace sidewall and the first trace base, and a second arcuate vertex between the first via sidewall and the first trace base;
an electronic component over the top surface of the substrate; and
an encapsulant over the top surface of the substrate and contacting a lateral side of the electronic component;
wherein the first arcuate vertex and the second arcuate vertex are in the first dielectric;
wherein the first via sidewall is in the first dielectric; and
wherein a majority of the first trace base is curved with respect to the top surface of the first dielectric.

2. The electronic device of claim 1, wherein the first trace and the first via comprise a monolithic structure.

3. The electronic device of claim 1, wherein the first trace is exposed from the top surface of the first dielectric and the first via is exposed from the bottom surface of the first dielectric.

4. The electronic device of claim 1, wherein the substrate comprises:
a second dielectric over the first dielectric, and
a second trace in the second dielectric offset from the first trace.

5. The electronic device of claim 4, wherein the second trace is exposed from a top surface of the second dielectric and contacts the top surface of the first dielectric.

6. The electronic device of claim 1, further comprising:
a second trace in the first dielectric and offset from the first trace,
wherein a top side of the second trace is exposed from the top surface of the first dielectric, and the first dielectric covers a base of the second trace.

7. The electronic device of claim 1, wherein the substrate comprises:
a second dielectric over the first dielectric,
a second trace in the second dielectric, and
a second via in the first dielectric,
wherein the second trace contacts the second via.

8. The electronic device of claim 1, wherein the substrate comprises:
a second dielectric over the first dielectric, and
a second conductor in the second dielectric comprising a second via and a second trace over the second via,
wherein the second trace comprises a second trace sidewall and a second trace base, and the second via comprises a second via sidewall, and
wherein the second conductor comprises a third arcuate vertex between the second trace sidewall and the second trace base, and a fourth arcuate vertex between the second via sidewall and the second trace base.

9. A method to manufacture an electronic device, comprising:
providing a first dielectric having a top surface and a bottom surface, wherein the first dielectric comprises a single layer of dielectric material;
providing a first trace pattern in the first dielectric from the top surface, wherein the first trace pattern defines a first trace comprising a first trace base, a first trace sidewall, and a first arcuate vertex between the first trace base and the first trace sidewall;
providing a first via pattern in the first dielectric, wherein the first via pattern defines a first via comprising a first via sidewall and a second arcuate vertex between the first trace base and the first via sidewall;
removing a portion of the first dielectric at the first trace pattern and the first via pattern to expose a first via opening and a first trace opening in the first dielectric; and
providing a first conductive material in the first via opening and the first trace opening to provide a first conductor comprising the first trace and the first via;
wherein the first arcuate vertex and the second arcuate vertex are in the first dielectric;
wherein the first via sidewall is in the first dielectric; and
wherein a majority of the first trace base is curved with respect to the top surface of the first dielectric.

10. The method of claim 9, further comprising:
providing an electronic component over the top surface of the first dielectric; and
providing an encapsulant over the top surface of the first dielectric and contacting a lateral side of the electronic component.

11. The method of claim 9, wherein the first trace pattern and the first via pattern are provided by exposing the first dielectric to ultraviolet (UV) light from the top surface.

12. The method of claim 9, wherein:
the first trace pattern defines a second trace in the first dielectric,
a portion of the first dielectric is removed to expose a second trace opening in the first dielectric, and
the first conductive material is provided in the second trace opening to provide a second conductor comprising the second trace.

13. The method of claim 12, further comprising:
providing a second dielectric over the first dielectric, the second dielectric having a top surface and a bottom surface,
providing a second trace pattern in the second dielectric from the top surface of the second dielectric, the second trace pattern defining a third trace,
removing a portion of the second dielectric at the second trace pattern to expose a third trace opening, and
providing a second conductive material in the third trace opening to provide a third conductor comprising the third trace,
wherein the third trace is offset from the first trace and the second trace.

14. The method of claim 9, wherein:
the first trace pattern defines a second trace in the first dielectric,
the first via pattern defines a second via in the first dielectric,
a portion of the first dielectric is removed to expose a second trace opening and a second via opening in the first dielectric, and
the first conductive material is provided in the second via opening and the second trace opening to provide the second trace and the second via.

15. The method of claim 14, wherein a width of the second trace is substantially same as a width of the second via.

16. The method of claim 14, further comprising:
providing a second dielectric over the first dielectric, the second dielectric having a top surface and a bottom surface, providing a second trace pattern in the second dielectric from the top surface of the second dielectric, wherein the second trace pattern defines a third trace, removing a portion of the second dielectric at the second trace pattern to expose a third trace opening, and providing a second conductive material in the third trace opening to provide the third trace, wherein the third trace is exposed from the bottom surface of the second dielectric and contacts the second trace of the first dielectric.

17. A method to manufacture an electronic device, the method comprising:

providing a first dielectric having a top surface and a bottom surface, wherein the first dielectric comprises a single layer of dielectric material, and a first conductor in the first dielectric comprising a first via and a first trace over the first via;

providing an electronic component over the top surface of the first dielectric; and providing an encapsulant over the top surface of the first dielectric and contacting a lateral side of the electronic component;

wherein the first trace comprises a first trace sidewall and a first trace base, and the first via comprises a first via sidewall; and wherein the first conductor comprises a first arcuate vertex between the first trace sidewall and the first trace base, and a second arcuate vertex between the first via sidewall and the first trace base;

wherein the first via sidewall, the first arcuate vertex, and the second arcuate vertex are between the top surface and the bottom surface of the first dielectric; and wherein a majority of the first trace base is curved with respect to the top surface of the first dielectric.

18. The method of claim 17, wherein the first trace and the first via comprise a monolithic structure.

\* \* \* \* \*